US012624443B2

(12) United States Patent
Salinas et al.

(10) Patent No.: US 12,624,443 B2
(45) Date of Patent: May 12, 2026

(54) PRECURSOR DELIVERY SYSTEM AND METHOD FOR HIGH SPEED CYCLIC DEPOSITION

(71) Applicant: Eugenus, Inc., San Jose, CA (US)

(72) Inventors: Martin J. Salinas, Campbell, CA (US); Miguel Saldana, Santa Cruz, CA (US); Victor Calderon, Santa Clara, CA (US); Santosh Narayan Ramachandra Kumar, Santa Clara, CA (US)

(73) Assignee: Eugenus, Inc., San Jose, CA (US)

( * ) Notice: Subject to any disclaimer, the term of this patent is extended or adjusted under 35 U.S.C. 154(b) by 1059 days.

(21) Appl. No.: 17/650,649

(22) Filed: Feb. 10, 2022

(65) Prior Publication Data

US 2022/0267898 A1 Aug. 25, 2022

Related U.S. Application Data

(60) Provisional application No. 63/149,039, filed on Feb. 12, 2021.

(51) Int. Cl.
C23C 16/34 (2006.01)
C23C 16/455 (2006.01)
(Continued)

(52) U.S. Cl.
CPC ........ *C23C 16/34* (2013.01); *C23C 16/45544* (2013.01); *C23C 16/45557* (2013.01); (Continued)

(58) Field of Classification Search
None
See application file for complete search history.

(56) References Cited

U.S. PATENT DOCUMENTS 6,897,119 B1 5/2005 Sneh et al.
2003/0145789 A1 8/2003 Bauch et al.
(Continued)

FOREIGN PATENT DOCUMENTS

CN 110541159 A 12/2019
CN 111549333 * 8/2020
(Continued)

OTHER PUBLICATIONS

English translation (with original) of WO-2005067015-A1, Published: Jul. 21, 2005, Name: Tominaga Koji, (Year: 2005).*
(Continued)

*Primary Examiner* — Mandy C Louie

(74) *Attorney, Agent, or Firm* — Knobbe, Martens, Olson & Bear, LLP

(57) ABSTRACT

The disclosed technology relates generally to semiconductor manufacturing, and more particularly to precursor delivery in cyclic deposition. In one aspect, a thin film deposition system comprises a thin film deposition chamber configured to deposit a thin film by alternatingly exposing a substrate to a plurality of precursors. The thin film system additionally comprises a precursor source connected to the thin film deposition chamber by a precursor delivery line, wherein the precursor delivery line comprises a high conductance line portion between the precursor source and a final valve outside of the thin film deposition chamber. The high conductance line portion is elongated in a flow direction and has a conductance that is at least four times greater than either of immediately adjacent low conductance line portions connected at opposing ends of the high conductance line portion. The thin film system further comprises a single final valve between the high conductance line portion and the thin film deposition chamber.

21 Claims, 16 Drawing Sheets

(51) Int. Cl.
   *H10P 14/20*     (2026.01)
   *H10P 14/24*     (2026.01)

(52) U.S. Cl.
   CPC ........ *C23C 16/45563* (2013.01); *H10P 14/24*
   (2026.01); *H10P 14/3416* (2026.01)

(56)               References Cited

U.S. PATENT DOCUMENTS

| | | |
|---|---|---|
| 2004/0048492 A1 | 3/2004 | Ishikawa et al. |
| 2004/0079286 A1 | 4/2004 | Lindfors |
| 2005/0147749 A1 | 7/2005 | Liu et al. |
| 2009/0081366 A1 | 3/2009 | Kerr et al. |
| 2015/0104575 A1 | 4/2015 | Takoudis et al. |
| 2017/0306485 A1 | 10/2017 | Lee et al. |
| 2018/0311700 A1* | 11/2018 | Ashizawa ......... H01L 21/76843 |
| 2019/0112707 A1* | 4/2019 | Liu ......................... C23C 16/52 |
| 2019/0161859 A1 | 5/2019 | Jiang et al. |

| | | |
|---|---|---|
| 2019/0390333 A1 | 12/2019 | Nishida et al. |
| 2020/0071827 A1 | 3/2020 | AuBuchon |
| 2021/0087688 A1 | 3/2021 | AuBuchon et al. |

FOREIGN PATENT DOCUMENTS

| | | | |
|---|---|---|---|
| EP | 1676067 | * | 3/2010 |
| JP | 2011166167 | * | 8/2011 |
| TW | 201903196 A | | 1/2019 |

OTHER PUBLICATIONS

Aaltonen, T. "Atomic Layer Deposition of Noble Metal Thin Films", Academic Dissertation, University of Helsinki, 2005, in 71 pages.

International Search Report and Written Opinion dated Apr. 6, 2022 in Application No. PCT/US2022/070611.

Search Report for TW 111105170, dated Jul. 11, 2025.

* cited by examiner

TiCl4 DELIVERY

| | TiCl4 PULSE | TiCl4 PURGE | NH3 PULSE | NH3 PURGE |
|---|---|---|---|---|
| CYCLE TIME(s) | 0.4 | 0.05 | 0.2 | 0.05 |

| 1.6SLM PM3 | 1.6SLM BETA | 3.2SLM BETA | 4.4SLM BETA |
|---|---|---|---|
| 278 | 276.5 | 552.7 | 760.4 |

TRANSIENT LINE PRESSURE WITHOUT RESERVOIR

PRESSURE (total)(Torr)

80.00
70.00
60.00
50.00
40.00
30.00
20.00

2.00

TIME (s)

TRANSIENT LINE PRESSURE AT RESERVOIR

TIME (s)

PRESSURE (total)(Torr)

250

148-1
RAPID
PURGE
(e.g.,Ar,N₂)

304-2
MULTI
VALVE BLOCK 2

304-1
MULTI
VALVE BLOCK 1

148-1
RAPID
PURGE (e.g.,Ar,N₂)

TC FOR BLOCK
TEMP
SENSING 144-1,144-2
2X PREC. 2
(e.g.,TiCl₄)

140-1,140-2
2X PREC. 1
(e.g.,DCS)

OT, THERMAL
SWITCH 220-1,220-2,
220-3,220-4
4X PREC. 3
(e.g.,NH₃)

LID/NOZZLE/DEPOSITION CHAMBER

LID/NOZZLE/DEPOSITION CHAMBER

PRECURSOR DELIVERY SYSTEM AND METHOD FOR HIGH SPEED CYCLIC DEPOSITION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the priority benefit under 35 U.S.C. § 119(e) to U.S. Provisional Patent Application No. 63/149,039, filed Feb. 12, 2021, entitled "HIGH CONDUCTANCE PRECURSOR DELIVERY SYSTEM FOR CYCLIC DEPOSITION," the content of which is hereby expressly incorporated by reference in its entirety.

BACKGROUND

Field of the Invention

The disclosed technology relates generally to semiconductor manufacturing, and more particularly to precursor delivery in cyclic deposition.

Description of the Related Art

As semiconductor devices continue to scale in lateral dimensions, there is a corresponding scaling of vertical dimensions of the semiconductor devices, including thickness scaling of the functional thin films such as electrodes and dielectrics. Semiconductor fabrication involves various thin films that are deposited throughout the process flow. Various thin films can be deposited using different techniques, including wet and dry deposition methods. Wet deposition methods include, e.g., aerosol/spray deposition, sol-gel method and spin-coating. Dry deposition methods include physical vapor-based techniques, e.g., physical vapor deposition (PVD) and evaporation. Dry deposition methods additionally include precursor and/or chemical reaction-based techniques, e.g., chemical vapor deposition (CVD) and cyclic deposition such as atomic layer deposition (ALD).

SUMMARY

In a first aspect, a thin film deposition system comprises a thin film deposition chamber configured to deposit a thin film by alternatingly exposing a substrate to a plurality of precursors. The thin film system additionally comprises a precursor source connected to the thin film deposition chamber by a precursor delivery line, wherein the precursor delivery line comprises a high conductance line portion between the precursor source and the thin film deposition chamber. The high conductance line portion is elongated in a flow direction and has a conductance that is at least four times greater than either of immediately adjacent low conductance line portions connected at opposing ends of the high conductance line portion. The thin film system further comprises a single final valve between the high conductance line portion and the thin film deposition chamber.

In a second aspect, a thin film deposition system comprises a thin film deposition chamber configured to deposit a thin film by alternatingly exposing a substrate to a plurality of precursors. The thin film system additionally comprises a precursor source connected to the thin film deposition chamber by a precursor delivery line, wherein the precursor delivery line comprises a high conductance line portion between the precursor source and a final valve outside of the thin film deposition chamber. The high conductance line portion is elongated in a flow direction and has a conductance that is at least four times greater than either of immediately adjacent low conductance line portions connected at opposing ends of the high conductance line portion. The system is configured such that during an exposure of the substrate to a precursor in the precursor source, the precursor continuously flows from the precursor source to the thin film deposition chamber through the high conductance line portion without being interrupted by actuation of another valve.

In a third aspect, a thin film deposition system comprises a plurality of processing stations sharing a thin film deposition chamber. Each of the processing stations comprises a gas distribution plate, a susceptor and a lid enclosing the thin film deposition chamber. The thin film deposition system additionally comprises a precursor source connected to the thin film deposition chamber by a precursor delivery line, wherein the precursor delivery line comprises a high conductance line portion between the precursor source and a final valve outside of the thin film deposition chamber. The high conductance line portion is elongated in a flow direction and has a conductance that is at least four times greater than either of immediately adjacent low conductance line portions connected at opposing ends of the high conductance line portion.

In a fourth aspect, a method of depositing a thin film comprises providing a thin film deposition system comprising a high conductance line portion as part of a precursor delivery line between a precursor source and a final valve outside of a thin film deposition chamber, wherein the high conductance line portion is elongated in a flow direction and has a conductance that is at least four times greater than either of immediately adjacent low conductance line portions connected at opposing ends of the high conductance line portion. The method additionally comprises alternatingly exposing a substrate in the thin film deposition chamber to a plurality of precursors in a plurality of cycles. Alternatingly exposing the substrate comprises pressurizing the high conductance line portion to a first pressure with a first one of the precursors with the final valve closed, and opening the final valve for a duration such that the pressure in the high conductance line portion remains above a second pressure lower than the first pressure by less than 10%.

In a fifth aspect, a thin film deposition system comprises a thin film deposition chamber configured to deposit a thin film by alternatingly exposing a substrate to a plurality of precursors. The thin film deposition system further comprises a precursor source connected to the thin film deposition chamber by a precursor delivery line. The precursor delivery line comprises an increased conductance portion serving as an intermediate precursor reservoir having a volume exceeding 0.3 L and disposed between the precursor source and the thin film deposition chamber.

In a sixth aspect, a thin film deposition system comprises a thin film deposition chamber configured to deposit a thin film by alternatingly exposing a substrate to a plurality of precursors. The thin film deposition system further comprises a precursor source connected to the thin film deposition chamber by a precursor delivery line. The precursor delivery line comprises an increased conductance portion serving as an intermediate precursor reservoir having a diameter exceeding 0.5 inches and disposed between the precursor source and the thin film deposition chamber.

In a seventh aspect, a thin film deposition system comprises a thin film deposition chamber configured to deposit a thin film by alternatingly exposing a substrate to a plurality of precursors. The thin film deposition system further comprises a precursor source connected to the thin film deposition chamber by a precursor delivery line for delivering one of the precursors into the thin film deposition chamber. The precursor delivery line comprises an increased conductance portion serving as an intermediate precursor reservoir configured such that an exposure time to the one of the precursors to reach substantial substrate surface saturation reduced by more than 50% relative to an exposure time to the one of the precursors to reach the substantial substrate surface saturation without the increased conductance portion.

In an eighth aspect, a thin film deposition system comprises a thin film deposition chamber configured to deposit a thin film by alternatingly exposing a substrate to a plurality of precursors. The thin film deposition chamber further comprises a precursor source connected to the thin film deposition chamber by a precursor delivery line for delivering one of the precursors into the thin film deposition chamber. The precursor delivery line comprises an increased conductance portion serving as an intermediate precursor reservoir configured such that an exposure time to the one of the precursors to reach substantial substrate surface saturation is less than half of a second.

In a ninth aspect, a thin film deposition system comprises a thin film deposition chamber configured to deposit a thin film by alternatingly exposing a substrate to a plurality of precursors. The thin film deposition system further comprises a precursor source connected to the thin film deposition chamber by a precursor delivery line for delivering one of the precursors into the thin film deposition chamber. The precursor delivery line comprises an increased conductance portion serving as an intermediate precursor reservoir configured such that opening a valve to introduce the one of the precursors into the thin film deposition chamber results in a pressure drop inside the intermediate precursor reservoir that does not exceed 50 Torr.

In a tenth aspect, a thin film deposition system comprises a thin film deposition chamber configured to deposit a thin film by alternatingly exposing a substrate to a plurality of precursors. The thin film deposition system comprises a precursor source connected to the thin film deposition chamber by a precursor delivery line for delivering one of the precursors into the thin film deposition chamber. The precursor delivery line comprises an increased conductance portion serving as an intermediate precursor reservoir configured such that the thin film deposited in a high aspect ratio trench or via having an aspect ratio exceeding 2 has a step coverage, defined as a ratio of a thickness of the thin film formed at a lower half of a sidewall of the high aspect ratio trench or via to a thickness of the thin film formed at an upper half of the sidewall of the high aspect ratio trench or via, that is higher by 10% or more relative to a step coverage of a thin film deposited in the high aspect ratio without the increased conductance portion.

In an eleventh aspect, a thin film deposition system comprises a thin film deposition chamber comprising a plurality of process stations each configured to deposit a thin film by alternatingly exposing a substrate to a plurality of precursors. The thin film deposition system further comprises a precursor source connected to the thin film deposition chamber by a precursor delivery line. The precursor delivery line comprises an increased conductance portion serving as an intermediate precursor reservoir having a volume exceeding 0.3 L. The precursor delivery line is connected to the precursor source at a first end and split into a plurality of local precursor delivery lines at a second end for delivering one of the precursors into each of the process stations.

DETAILED DESCRIPTION

Figure 1:
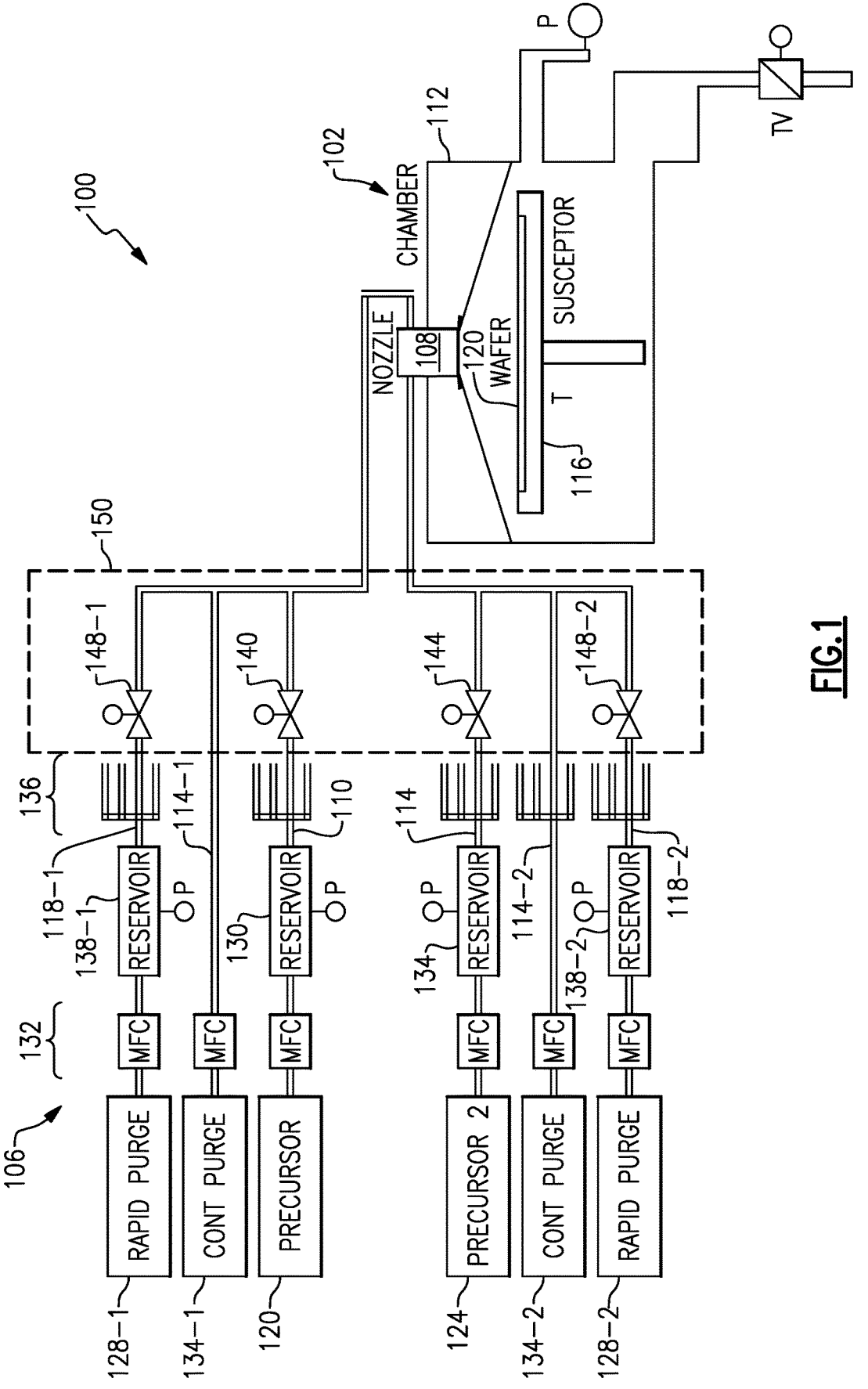
FIG. 1 schematically illustrates a thin film deposition system including a thin film deposition chamber and a precursor delivery system configured with precursor delivery lines including high conductance line portions, according to embodiments.

Cyclic deposition processes such as atomic layer deposition (ALD) processes can provide a relatively conformal thin films on relatively high aspect-ratio (e.g., 2:1) structures with high uniformity and thickness precision. While generally less conformal and uniform compared to ALD, thin films deposited using continuous deposition processes such as chemical vapor deposition (CVD) can provide higher productivity and lower cost. ALD and CVD can be used to deposit a variety of different films including elemental metals, metallic compounds (e.g., TiN, TaN, etc.), semiconductors (e.g., Si, III-V, etc.), dielectrics (e.g., $SiO_2$, AlN, $HfO_2$, $ZrO_2$, etc.), rare-earth oxides, conducting oxides (e.g., $IrO_2$, etc.), ferroelectrics (e.g., $PbTiO_3$, $LaNiO_3$, etc.), superconductors (e.g., $YBa_2Cu_3O_{7-x}$), and chalcogenides (e.g., GeSbTe), to name a few.

Some cyclic deposition processes such as atomic layer deposition (ALD) include alternatingly exposing a substrate to a plurality of precursors to form a thin film. The different precursors can alternatingly at least partly saturate the surface of the substrate and react with each other, thereby forming the thin film in a layer-by-layer fashion. Because of the layer-by-layer growth capability, ALD can enable precise control of the thickness and the composition, which in turn can enable precise control of various properties such as conductivity, conformality, uniformity, barrier properties and mechanical strength. Because of the nature of deposition process in ALD, the precursor delivery systems of ALD deposition systems face unique challenges compared to, e.g., the precursor delivery systems of CVD deposition systems. For example, because the alternating exposures of the substrate to multiple precursors are repeatedly carried out at a relatively high speed and/or at a relatively high frequency, precursor delivery systems or components thereof such as precursor delivery lines valves can directly or indirectly pose significant limitations to various aspects of the ALD deposition processes, including precision, throughput, reliability and operating cost thereof. Because deposition of a thin film by ALD may involve from few to as much as thousands of cycles of alternating exposures to different precursors, the numbers, durations and frequencies of the alternating exposures of the substrate to multiple precursors is directly proportional to the throughput. The numbers, durations and frequencies of the exposures can in turn be limited by the precursor delivery system or components thereof, such as precursor delivery line configurations. In particular, the conductance, volume and pressure stability of the precursor delivery lines can directly impact deposition throughput, the efficiency of precursor use and the quality of the resulting thin film. Thus, there is a need for improved precursor delivery systems having fast valves and delivery lines adapted for high conductance, high volume and high pressure stability for increased throughput as well as improved film properties such as high step coverage, conformality and uniformity.

Precursor Delivery System with High Conductance Precursor Delivery Lines

To address the above-mentioned needs among others, a thin film deposition system comprises a thin film deposition chamber configured to deposit a thin film by alternatingly exposing a substrate to a plurality of precursors. The thin film deposition system further comprises a precursor source connected to the thin film deposition chamber by a precursor delivery line. The precursor delivery line comprises an increased or high conductance line portion serving as an intermediate precursor reservoir disposed between the precursor source and the thin film deposition chamber. The configuration allows for higher dosage of precursors per cycle that the substrate is exposed to in the process chamber, which in turn can lead to a substantial reduction in precursor exposure times to reach substantial substrate surface saturation by the precursors. The configuration also allows for increased stability of the precursors delivered into the process chamber. For example, the configuration allows for increased dosage with reduced pressure fluctuation in the delivery lines by providing an intermediate precursor reservoir serving as a high conductance buffer between the thin film deposition chamber and the precursor sources. The configuration can be especially advantageous for process chambers having multiple process stations, which can use much higher amounts of precursors and purge gases. The increased dosage and stability of the precursors delivered by the precursor delivery system according to embodiments advantageously enables improved step coverage and uniformity of the thin film in high aspect ratio structures.

As described herein, a high conductance line portion refers to a delivery line portion that is elongated in a flow direction with first and second ends serving as inlet and an outlet, respectively. The high conductance line portion has a conductance or volume per length that is greater relative to adjacent line portions connected to both ends thereof. For example, the high conductance line portion can have a cylindrical shape, where the length is greater than the diameter. The inventors have found that this configuration of the high conductance line portion is advantageous in serving as an intermediate reservoir while optimizing the conductance of the gas flowing therethrough. For example while a reservoir or a tank in which the inlet and the outlet are disposed on the same side may serve as a reservoir, such configuration may lower the conductance of the gas passing therethrough.

As described herein, an atomic layer deposition (ALD) valve refers to a precursor delivery valve configured for introducing a precursor into an ALD deposition chamber in pulses with high precision and speed (e.g., a response time less than 30 ms) while having a high flow coefficient (e.g., $C_v$ exceeding 0.20). Because deposition of a thin film by ALD may involve from few to as much as thousands of cycles of alternating exposures to different precursors, valve parameters such as the flow rate, speed and/or frequency of the ALD valves can directly impact deposition throughput as well as the efficiency of precursor use. In addition, the wear of ALD valves can limit the service life of some ALD systems between preventive maintenance services. Some precursors, which are delivered at elevated temperatures, can further limit the throughput and service life of some ALD systems.

In the following, embodiments may be described using specific precursors. For example, specific examples precursors including $TiCl_4$, $NH_3$ and $SiCl_2H_2$ for depositing TiN and/or TiSiN may be used to describe the thin film deposition system of a method of depositing a thin film. However, it will be understood that embodiments are not so limited, and the inventive aspects can be applied to any suitable combination of precursors for depositing any suitable thin film that can be formed using cyclic deposition processes such as ALD.

In the following, embodiments may be described using specific precursors for specific films by way examples. For example, specific example precursors including $TiCl_4$, $NH_3$ and $SiCl_2H_2$ for depositing TiN and/or TiSiN may be used to describe the thin film deposition system and a method of depositing a thin film according to various embodiments. However, it will be understood that embodiments are not so limited, and the inventive aspects can be applied to any suitable combination of precursors for depositing any suitable thin film that can be formed using cyclic deposition processes such as ALD.

FIG. 1 schematically illustrates a thin film deposition system including a thin film deposition chamber and a precursor delivery system configured with precursor delivery lines including high conductance line portions, according to embodiments. The thin film deposition system 100 includes a thin film deposition chamber 102 and a precursor delivery system 106 configured to deliver a plurality of precursors into the deposition chamber 102. The illustrated deposition chamber 102 is configured to process a substrate 120, e.g., a wafer, on a support 116, e.g., a susceptor, under a process condition. The deposition chamber 102 additionally includes a nozzle 108 configured to centrally discharge the plurality of precursors into the deposition chamber 102 through a gas distribution plate 112, also referred to as a showerhead. The nozzle 108 may mix gases, e.g., a precursor and a purge gas, prior to being diffused into the deposition chamber 102 by the gas distribution plate 112. The gas distribution plate 112 is configured to uniformly diffuse the precursor(s) over the substrate 120 on the susceptor 116 so that a uniform deposition occurs. The deposition chamber may be equipped with pressure monitoring sensors (P) and/or temperature monitoring sensors (T).

The precursor delivery system 106 is configured to deliver a plurality of precursors from precursor sources (120, 124) and one or more purge gases, e.g., inert gases, from purge gas sources (128-1, 128-2, 134-1, 134-2) into the process chamber. Each of the precursors and purge gases is connected to the deposition chamber 102 by a respective gas delivery line. Advantageously, at least some of the gas delivery lines comprise increased conductance line portions serving as intermediate gas reservoirs between the precursor or purge gas sources and the thin film deposition chamber 102. The gas delivery lines additionally include in their paths mass flow controllers (MFCs) 132 and respective precursor valves for introducing respective precursors into the thin film deposition chamber. Further advantageously, at least some of the valves can be atomic layer deposition (ALD) valves. The gas delivery lines are connected to the deposition chamber 102 through the gas distribution plate 112.

For illustrative purposes only, in the illustrated configuration of FIG. 1, the plurality of precursors include a first precursor and a second precursor. The first precursor is stored in at least one first precursor source 120, and the second precursor is stored in at least one second precursor source 124. The precursor delivery system 106 is configured to deliver the first and second precursors from the first and second precursor sources 120, 124 into the deposition chamber 102 through first and second precursor delivery lines 110, 114, respectively. The first and second precursor delivery lines 110, 114 include high conductance line portions 130, 134, respectively. A rapid purge (RP) gas can be stored in at least two RP gas sources 128-1, 128-2. The precursor delivery system 106 is configured to deliver the rapid purge (RP) gas from the RP gas sources 128-1, 128-2 into the deposition chamber 102 through respective ones of RP gas delivery lines 118-1, 118-2. The RP gas delivery lines 118-1, 118-2 include high conductance line portions 138-1, 138-2, respectively. A continuous purge (CP) gas can be s stored in at least two CP gas sources 134-1, 134-2. The precursor delivery system 106 is configured to deliver the CP gas from the CP gas sources 134-1, 134-2 into the deposition chamber 102 through respective ones of CP gas delivery lines 114-1, 114-2.

The first and second precursors are configured to be delivered from the first and second precursor sources 120, 124, respectively, by independently actuating first and second precursor atomic layer deposition (ALD) valves 140 and 144 that are connected in parallel to the common gas distribution plate 112. Additionally, the RP purge gas is configured to be delivered from the RP purge gas sources 128-1, 128-2 by independently actuating two respective purge gas atomic layer deposition (ALD) valves 148-1, 148-2 that are connected in parallel to the common gas distribution plate 112. The ALD valves 140, 144, 148-1 and 148-2 and the respective delivery lines connected to the gas distribution plate 112 can be arranged to feed the respective gases into the nozzle 108 through a multivalve block assembly 150 (FIG. 5A), which may be attached to a lid of the deposition chamber 102. In the illustrated configuration, the ALD valves 140, 144, 148-1 and 148-2 are final valves before the respective gases are introduced into the deposition chamber 102.

By way of example only, the first and second precursors can include $TiCl_4$ and $NH_3$, respectively, that are delivered into the deposition chamber 102 from respective $TiCl_4$ and $NH_3$ sources through respective precursor delivery lines to form, e.g., TiN. The precursor delivery system can additionally be configured to deliver Ar as the purge gas into the process chamber from Ar sources through purge gas delivery lines. Purge gases may be delivered as a continuous purge (CP) gas, which may be delivered through precursor ALD valves, and/or as a rapid purge (RP) gas, which may be delivered through dedicated purge gas ALD valves as shown in FIG. 1. The illustrated precursor delivery system 100 can be configured to deliver Ar as an RP gas into the process chamber 102 from the purge gas sources 128-1, 128-2 through respective purge gas delivery lines and purge gas ALD valves 148-1, 148-2.

According to various embodiments, the thin film deposition system 100 is configured for thermal ALD without an aid of plasma. While plasma-enhanced processes such as plasma enhanced atomic layer deposition (PE-ALD) may be effective in forming conformal films on surfaces having relatively low aspect ratios, such processes may not be effective in depositing films inside vias and cavities having relative high aspect ratios. Without being limited by theory, one possible reason for this is that a plasma may not reach deeper portions of high aspect ratio vias under some circumstances. In these circumstances, different portions of the vias may be exposed to different amounts of the plasma, leading to undesirable structural effects arising from non-uniform deposition, such as thicker films being deposited near the opening of the via compared to deeper portions (sometimes called cusping or keyhole formation). For these reasons, a thermal cyclic vapor deposition such as thermal ALD may be more advantageous, because such thermal processes do not depend on the ability of the plasma to reach portions of the surface being deposited on.

The illustrated precursor delivery system 100 provides increased flow and stability of the precursors delivered into the deposition chamber 102 in part due to the presence of the high conductance line portions of the delivery lines. The inventors have discovered that achieving short precursor exposure times without sacrificing stability can be particularly difficult for process chambers having multiple process stations as described herein (e.g., FIGS. 2A, 2B), due the higher combined volumes of precursors that are delivered to the multiple process stations.

Figure 2A:
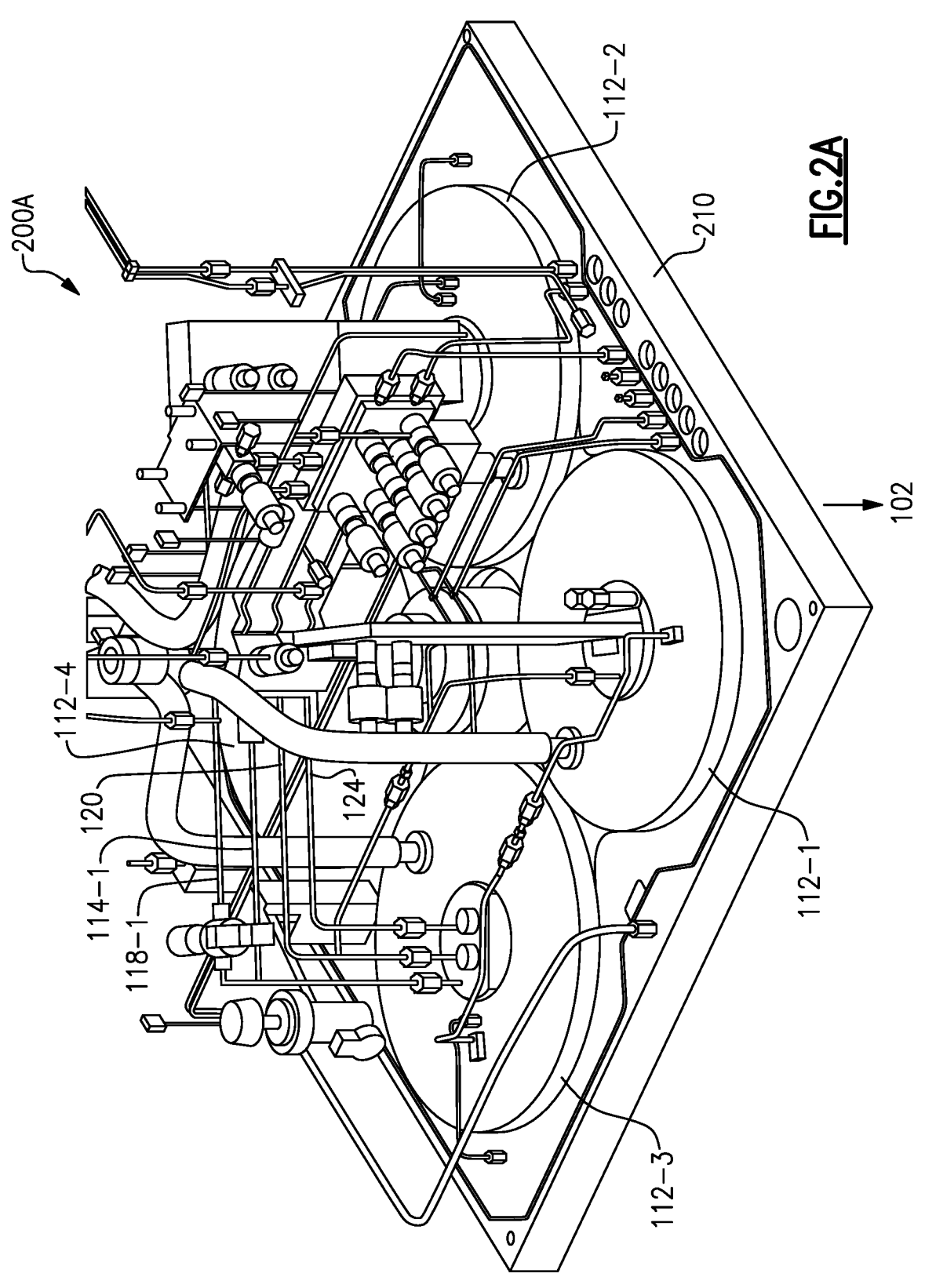
FIG. 2A shows a perspective view of a lid portion of a deposition chamber comprising multiple processing stations that is configured to introduce precursors through conventional precursor delivery lines.

FIG. 2A shows an example base deposition chamber which can particularly benefit from various embodiments disclosed herein, including high conductance line portions and ALD valves. FIG. 2A shows a perspective view of a lid portion 210 of a deposition chamber 200A comprising multiple processing stations. Each processing station is configured to process a substrate under a unique process condition, including a process temperature, a process pressure and a combination of precursors. In the illustrated embodiment, there are four processing stations having corresponding lids 112-1, 112-2, 112-3, 112-4. The processing stations can be, e.g., single substrate processing stations each configured to deliver one or more precursors through respective precursor delivery lines. While the illustrated process chamber is a multi-station process chamber, it will be appreciated that the embodiments disclosed herein are not limited thereto, and can be implemented in any suitable single wafer multi-wafer process chambers. The illustrated top portions of the lids 112-1, 112-2, 112-3, 112-4 are physically outside the deposition chamber 102 (FIG. 1). Inside the process chamber, each of the lids 112-1, 112-2, 112-3, 112-4 includes or has attached thereto a gas distribution plate (not shown), also referred to as a showerhead, configured to diffuse the precursor(s) over a substrate on the susceptor.

Each processing station can be configured, e.g., in a similar manner as described above with respect to FIG. 1, and comprises the respective one of the lids 112-1, 112-2, 112-3, 112-4. Referring back to FIG. 1, after a respective one of the MFCs, each of the gas delivery lines branch off into multiple lines at a respective manifold 136. Each of the branched off lines can feed a respective gas into one of the processing stations. For example, feeding into each lid are four gas lines, e.g., ¼" lines, which can correspond to gas delivery lines 118-1, 114-1, 110 and 114 as described above with respect to FIG. 1. The illustrated deposition chamber comprises one or more processing stations each configured to process a substrate on a support, e.g., a susceptor, under a process condition, in a similar manner as described above with respect to FIG. 1.

The example base deposition chamber such as that shown in FIG. 2A can particularly benefit from various combination of embodiments disclosed herein, including high conductance line portions and ALD valves, such that exposures to each precursor can be substantially shortened without sacrificing desirable film characteristics such as conformality, step coverage and uniformity.

High Conductance Line Portions for High Speed Cyclic Deposition Systems

Figure 2B:
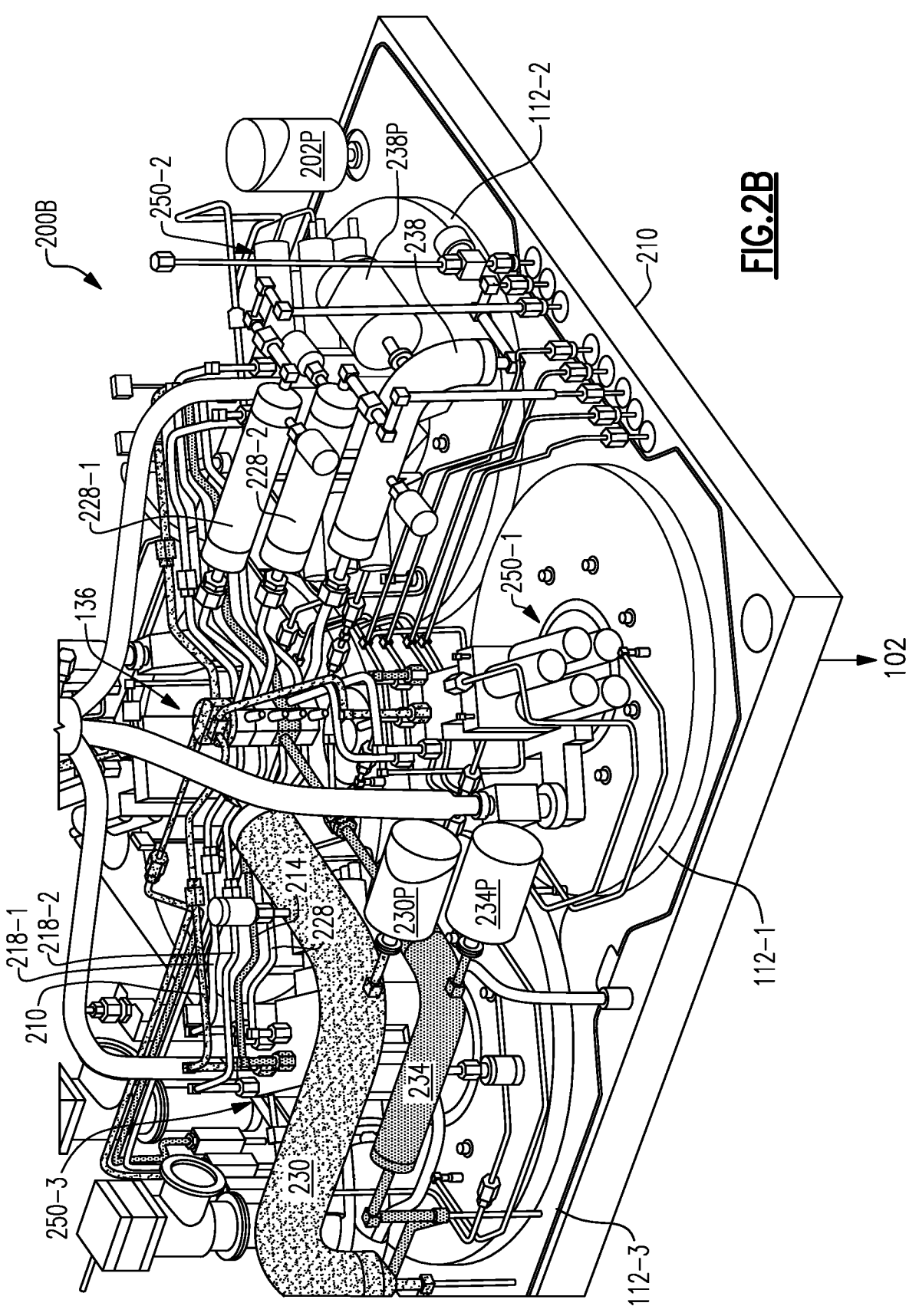
FIG. 2B shows a perspective view of a lid portion of a deposition chamber comprising multiple processing stations that is configured to introduce precursors through precursor delivery lines having high conductance line portions, according to embodiments.

Various combinations of enabling features for high speed cyclic deposition as disclosed herein include high conductance line portions that serve as an intermediate reservoir with high conductance and flow rate therethrough. FIG. 2B shows a perspective view of a lid portion of a deposition chamber comprising multiple processing stations that is configured to introduce precursors through precursor delivery lines having high conductance line portions, according to embodiments. The lid portion 210 of the deposition chamber 200B can represent one example of the lid portion 210 described in FIG. 2A in which various features including high conductance line portions and ALD valves have been implemented, according to various embodiments. For clarity, FIG. 2C shows a perspective view of the precursor delivery lines having high conductance line portions for the process chamber illustrated in FIG. 2B, without other components.

The illustrated lid portion 210 of a deposition chamber 200B includes base components that are similar to those of the lid portion 210 of the deposition chamber 200A described above with respect to FIG. 2A, a detailed description of which is not repeated herein for brevity. For example, the lid portion deposition chamber 200B includes the lids 112-1, 112-2, 112-3, 112-4, each of which is equipped with a precursor delivery system for delivering a plurality of precursors and one or more purge gases. Each of the precursors and purge gases is connected to the deposition chamber 200B by a respective gas delivery line. Each of the delivery lines is connected to the respective gas source on the one end as described above with respect to the thin film deposition system illustrated in FIG. 1. On the other end, the delivery line is split into four local delivery lines connected to ALD valves that are in turn connected to showerheads four processing stations.

In the thin film deposition chamber 200A illustrated in FIG. 2A, the gas delivery lines may be standard gas lines having a diameter, e.g., 0.25-0.5 inches, which can be constant throughout the gas delivery lines. Unlike the gas delivery lines of the thin film deposition chamber illustrated in FIG. 2A, at least some of the gas delivery lines illustrated in FIG. 2B comprise increased conductance line portions serving as intermediate gas reservoirs between the precursor or purge gas sources and the thin film deposition chamber 200B, according to various embodiments.

Figure 2C:
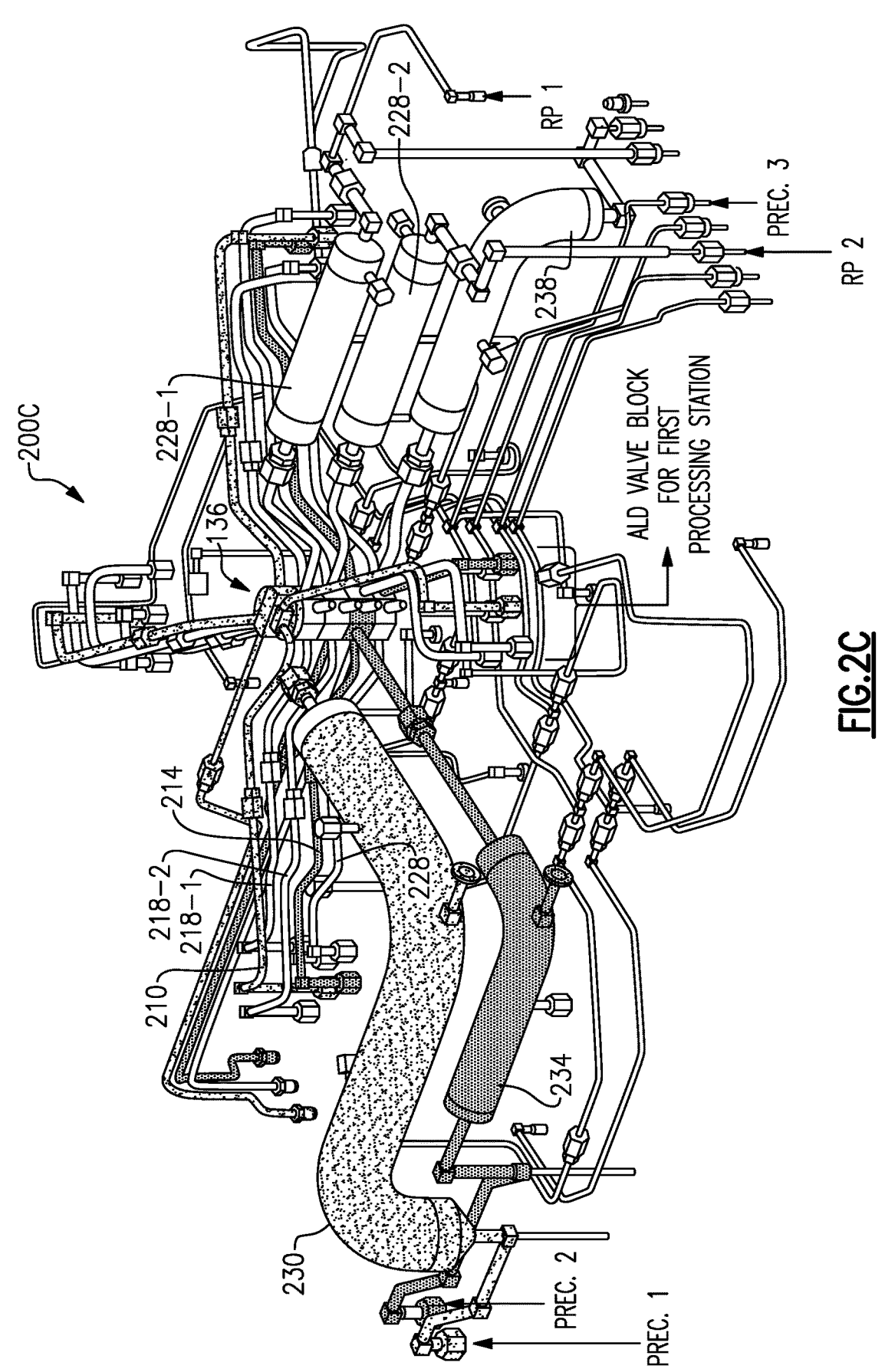
FIG. 2C shows a perspective view of the precursor delivery lines having high conductance line portions for the deposition chamber illustrated in FIG. 2B.

In reference to FIG. 2B in conjunction with FIG. 2C for clarity, the high conductance line portions are disposed between the respective gas sources and the thin film deposition chambers, prior to the gas delivery lines being splitting into local delivery lines for delivering the gases into multiple processing stations.

Referring to FIGS. 2B and 2C, the illustrated thin film deposition chamber 200B and the precursor delivery system 200C are configured for delivering three different precursors and a rapid purge gas through respective gas delivery lines including high conductance line portions. In a similar manner as described above with respect to FIG. 1, first, second and third precursors (Prec. 1, Prec. 2, Prec. 3) are stored in their respective first, second and third precursor sources (not shown). In a manner similar to the precursor delivery system 106 (FIG. 1) described above, the precursor delivery system 200C is configured to deliver the first, second and third precursors (Prec. 1, Prec. 2, Prec. 3) from the first, second and third precursor sources into the deposition chamber 102 (FIG. 1) through first, second and third precursor delivery lines 210, 214 and 228, respectively. The first, second and third precursor delivery lines 210, 214 and 228 include respective high conductance line portions 230, 234 and 238, respectively. The high conductance line portions 230, 234 and 238 have attached thereto pressure monitoring sensors 230P, 234P and 238P, respectively. In addition, a rapid purge (RP) gas can be stored in respective RP gas sources (not shown). In a manner similar to the precursor delivery system 106 (FIG. 1) described above, the precursor delivery system 200C is configured to deliver the RP gas from the RP gas sources into the deposition chamber 102 (FIG. 1) through respective ones of RP gas delivery lines 218-1, 218-2. The RP gas delivery lines 218-1, 218-2 include high conductance line portions 228-1, 228-2, respectively.

According to various embodiments, the high conductance delivery line portions serving as intermediate gas reservoirs are included as at least portions of some of the gas delivery lines. The inventors have discovered that the relatively high conductance of the high conductance line portions advantageously allows for relatively high volumes of gases to pass therethrough to reduce the precursor or purge gas exposure time. By way of example only, in the example configurations illustrated in FIGS. 2B and 2C, the high conductance line portions 230, 234 and 238 for precursor the delivery lines 210, 214 and 228, respectively, and the high conductance line portions 228-1 and 228-2 for RP purge gas delivery lines 218-1 and 218-3, respectively, are elongated in a flow direction e.g., in a cylindrical shape, and have a diameter exceeding 0.5 in, 1 in., 1.5 in., 2.0 in., 2.5 in., 3.0 in., 3.5 in., 4.0 in., 4.5 in., 5 in., or having a value in a range defined by any of these values. The high conductance line portions additionally have a length exceeding 5 in., 10 in., 20 in., 50 in., 100 in., or a value in range defined by any of these values. As configured, relative to the low conductance line portions being formed of standard diameters, e.g., 0.25" or 0.5", the conductance of the high conductance line portions can be greater than 4, 10, 20, 50, 100, 200, 500, 1000, 2000, 5000, 10,000 or a value in a range defined by these values or higher, according to various embodiments.

The inventors have further found that, in addition to high conductance for high flow rate, the high conductance line positions are advantageously configured to supply sufficient volumes of the precursor and purge gases such repeated or relatively long exposures result inn relatively small amount of pressure fluctuation or drift. According to various embodiments, the high conductance line portions have a volume exceeding 0.3 L, 0.5 L, 1.0 L, 1.5 L, 2.0 L, 2.5 L, 3.0 L, 3.5 L, 4.0 L, 4.5 L, 5.0 L, of a value in a range defined by any of these values. By way of example only, in the embodiment illustrated in FIGS. 2B and 2C, the high conductance line portions of the gas delivery lines for the Prec. 1 (e.g., $TiCl_4$), the Prec. 2 (e.g., $SiH_2Cl_2$), the Prec. 3 (e.g., $NH_3$) and RP (e.g., $N_2$) have volumes of 3.4 L, 0.56 L, 0.56 L and 0.4 L, respectively.

Advantageously, the delivery lines including the high conductance line portions as described herein are configured to deliver high precursor doses for a given pulse of precursor exposure. According to embodiments, the delivery lines are configured to flow gases at flow rates greater than 50 sccm, 1000 sccm, 2000 sccm, 4000 sccm, 6000 sccm, 8000 sccm, 10,000 sccm, for a value in a range defined by any of these values. Advantageously, the relatively high doses can reduce the exposure time or the number of pulses to reach a certain substrate surface saturation level, or both.

The inventors have realized that, in addition to the physical shape and dimensions of the high conductance delivery lines as disclosed herein, the positioning thereof relative to the point of entry into the deposition chamber can be advantageously optimized to reduce the residence time of the precursor. As illustrated in FIG. 2B, the high conductance line portions 230, 234 and 238 for precursor delivery and the high conductance line portions 228-1, 228-2 for purge gas delivery are disposed above the lid portion 210 to overlap at least one of the lids 112-1, 112-2, 112-3, 112-4. In addition, from the point of exit from the high conductance line portions, the length of low conductance line portions (including the portion from the point of exit to the manifold 136 and the portion from the manifold to the ALD valve block) to the respective ALD block for a given gas is within 30", 25", 20", 15", 10" or a distance within a range defined by any of these values.

Figure 3:
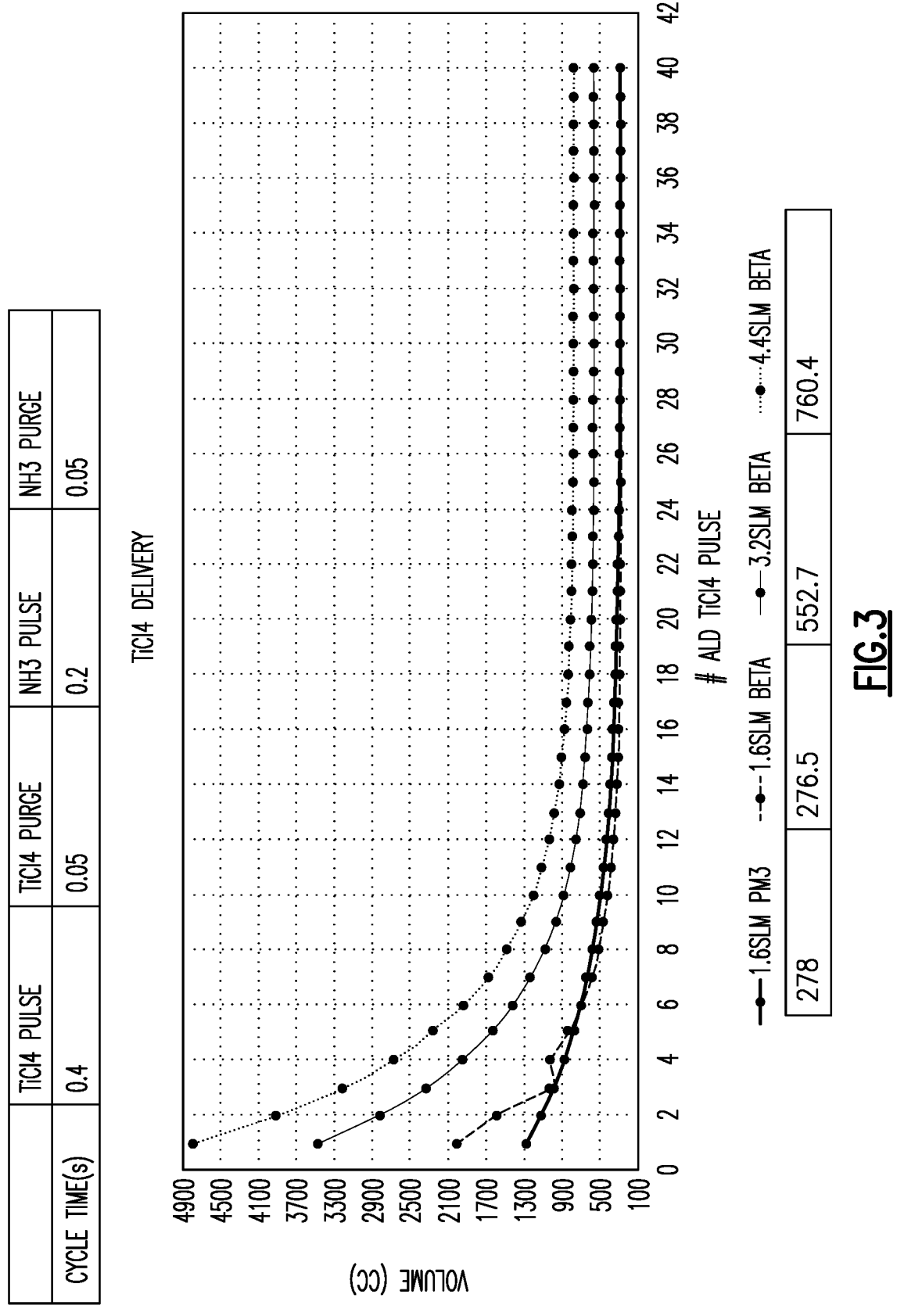
FIG. 3 is an experimental graph showing precursor volumes delivered to a process chamber with successive exposure pulses for different high conductance line portions having different volumes.

FIG. 3 is an experimental graph showing precursor volumes delivered to a process chamber with successive exposure pulses for different high conductance line portions having different volumes. The measurement was taken from a precursor delivery line similar to the first precursor delivery line 210 including the high conductance line portion 230 as described above with respect to FIGS. 2B and 2C, using $TiCl_4$ as an example. The measurements were made by first charging the precursor delivery line including the high conductance line portion and successfully applying multiple cycles of ALD deposition. The measurements were taken for delivery lines configured for flow rates of 1.6 standard liters per minute (SLM), 3.2 SLM and 4.4 SLM. The experimental ALD cycle used for obtaining the data is indicated at top, which included a 0.4 sec. $TiCl_4$ pulse, a 0.05 sec, rapid purge, a 0.2 sec. $NH_3$ pulse and 0.05 sec. rapid purge carried out in sequence. For the precursor delivery lines configured for different flow rates of 1.6 SLM, 3.2 SLM and 4.4 SLM, the volumes of gas delivered with each successive pulse decreases nonlinearly with increasing number of pulses. For the precursor delivery lines configured for different flow rates of 1.6 SLM, 3.2 SLM and 4.4 SLM, the observed volumes of precursor delivered by the first pulse were about 0.27 L, 0.55 L and 0.76 L, respectively, with the 0.4 sec. pulse. According to various embodiments, volume of gas delivered per 0.4 sec can exceed 0.2 L, 0.4 L, 0.6 L, 0.8 L, 1.0 L, 1.2 L, 1.5 L, or have a value in a range defined by any of these values.

Figure 4A:
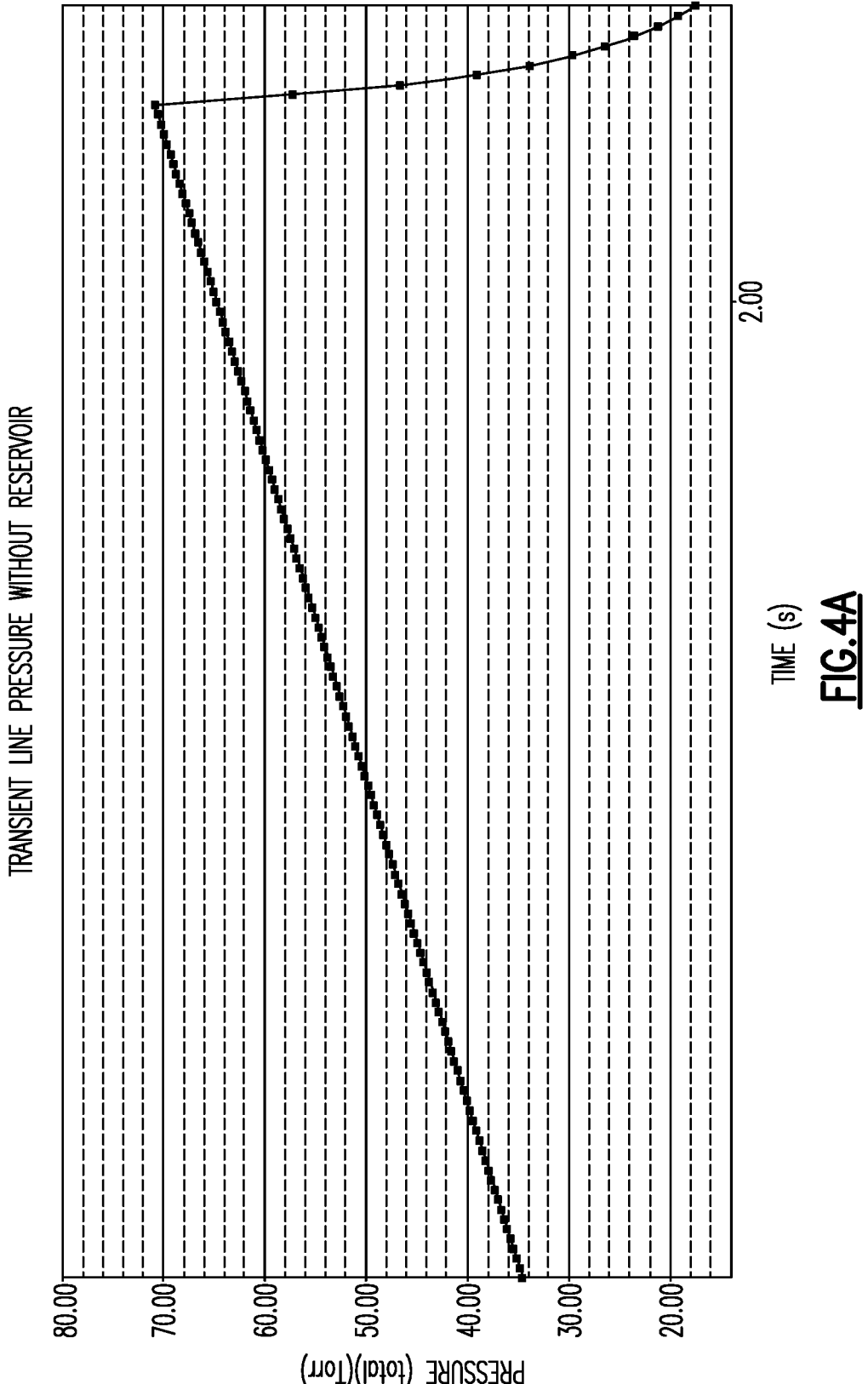
FIGS. 4A and 4B show experimental measurements of pressure changes in the precursor delivery lines, with and without a high conductance line portion, respectively, upon opening an atomic layer deposition (ALD) valve to introduce the precursor into the thin film process chamber.
Figure 4B:
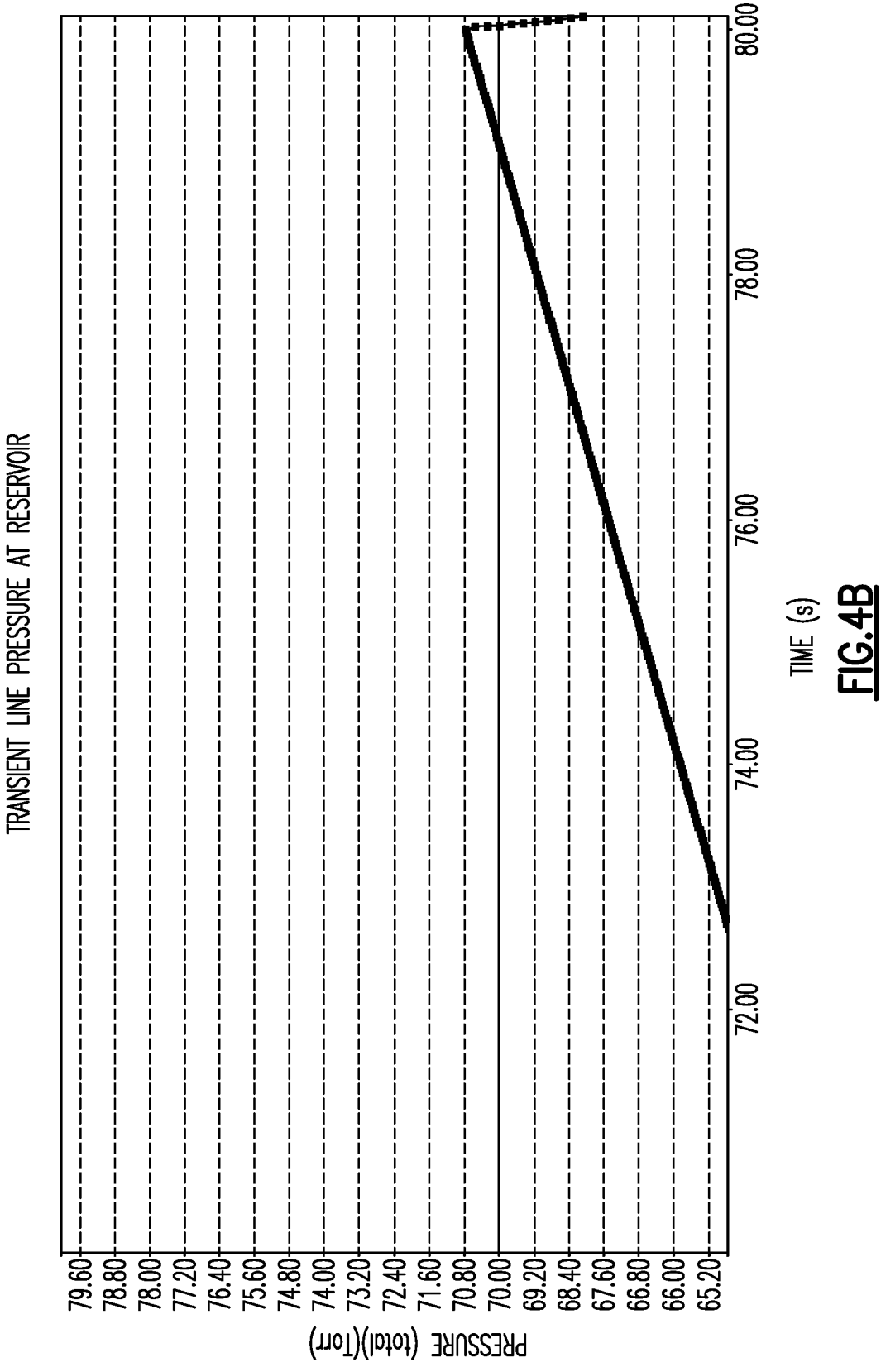

FIGS. 4A and 4B show experimental measurements of pressure changes in the precursor delivery lines, with and without a high conductance line portion, respectively, upon opening an atomic layer deposition (ALD) valve to introduce the precursor into the thin film process chamber. The pressure change was measured from a precursor delivery line similar to the first precursor delivery line 210 including the high conductance line portion 230 respectively as described above with respect to FIGS. 2B and 2C, using the pressure monitoring sensor 230P as shown in FIG. 2B. The measurements were made by first charging the precursor delivery line 210 with $TiCl_4$ as an example precursor and opening the ALD valve connected thereto for 0.1 sec. As shown, the presence of the high conductance line portion 230 advantageously greatly reduces the pressure drop in the precursor delivery line. As shown in FIG. 4A, without the high conductance line portion 230, the pressure drop inside the precursor delivery line can exceed 50 Torr or 70% (from 71 Torr to 17 Torr). In contrast, opening a valve, e.g., an ALD valve connected to the precursor delivery line 210 including the high conductance line portion 230 according to embodiments to introduce a precursor into the thin film deposition chamber results in a significantly lower pressure drop. As shown in FIG. 4B the pressure drop inside the precursor delivery line does not exceed 3 Torr or 5%. As described infra with respect to FIG. 8A, the inventors have shown that the pre-charge pressure can be critical for obtaining high step coverage values for films deposited in a via or trench.

Based on experiments similar to that illustrated in FIGS. 4A and 4B, the inventors have determined that one or more of a pressure inside the high conductance line portion immediately before actuating the ALD valve, a pressure change in the high conductance line portion during exposure, a run-to-run standard deviation of the mean pressure inside the high conductance line portion, and a run-to-run pressure drift of the mean pressure inside the high conductance line portion can be critical for certain film characteristics, such as step coverage. According to embodiments, the pressure inside the delivery line portion prior to opening the ALD valve to expose the substrates is kept above 40 Torr, 50 Torr, 60 Torr, 70 Torr, 80 Torr, 100 Torr, 120 Torr, 140 Torr, 160 Torr, 180 Torr, 200 Torr, or a value in a range defined by any of these values. According to embodiments, at least in part due to the presence of the high conductance line portions, a pressure change or drop at the high conductance line portion upon valve opening, e.g., for less than 1 sec., is less than 50 Torr, 40 Torr, 30 Torr, 20 Torr, 10 Torr, 5 Torr, 3 Torr, 1 Torr, or a value in a range defined by any of these values, or less than 70%, 60%, 50%, 40%, 30%, 20%, 10%, 5%, 2%, or a value in a range defined by any of these values. Further according to embodiments, at least in part due to the presence of the high conductance line portions, a run-to-run standard deviation of pressure change at the high conductance line portion is less than 5 Torr, 4 Torr, 3 Torr, 2 Torr, 1 Torr, 0.5 Torr, 0.3 Torr, 0.1 Torr, or a value in a range defined by any of these values, or less than 20%, 15%, 10%, 5%, 2%, 1% of the mean value, or a value in a range defined by any of these values. Further according to embodiments, at least in part due to the presence of the high conductance line portions, a run-to-run drift of the mean pressure at the high conductance line portion is less than 20 Torr, 15 Torr, 10 Torr, 8 Torr, 6 Torr, 4 Torr, 2 Torr or a value in a range defined by any of these values, or less than 30%, 25%, 20%, 15%, 10%, 5% of the mean value, or a value in a range defined by any of these values. Without limitation, further experimental validation of these parameters in providing various process stability and improved film characteristics including step coverage for high aspect ratio openings and within-wafer uniformity of the thickness is illustrated with respect to FIGS. 8A-8C.

Advantageously, the high conductance line portions serving as intermediate gas reservoirs according to embodiments allow for various advantageous technical effects described herein, e.g., high flow rate and reduced exposure time for process chambers including one or more processing stations, without excessively increasing the pressure inside the precursor delivery line, which can in turn improve safety in accordance with the industry standard. According to embodiments, the increased conductance line portion is configured to maintain a pressure inside the delivery lines that is less than 650 Torr, 600 Torr, 550 Torr, 500 Torr, 450 Torr, 400 Torr, 350 Torr, 300 Torr, 250 Torr, 200 Torr, 150 Torr, 100 Torr, 50 Torr, or a value in a range defined by any of these values.

ALD Valves for High Speed Cyclic Deposition Systems

Various combinations of enabling features for high speed cyclic deposition as disclosed herein further include ALD valves as disclosed herein. Referring back to FIG. 2B, the thin film deposition chamber 200B is configured with delivery lines with high conductance line portions for delivering precursor and purge gases. After the high conductance line portions, each delivery line branches off from respective common manifolds 136, in a similar manner as described above with respect to FIG. 1. For delivering the precursors and purge gases to respective processing stations, the lid portion 210 of the deposition chamber 200B comprises the lid portions 112-1, 112-2, 112-3, 112-4 attached thereon. The lid portions 112-1, 112-2, 112-3, 112-4 have disposed at central locations thereof respective ones of multivalve blocks 250-1, 250-2, 250-3, 250-4. The multivalve blocks 250-1, 250-2, 250-3, 250-4 in turn have attached thereto a plurality of ALD valves, which can further enable fast cyclic deposition. Example configurations of these multivalve blocks 250-1, 250-2, 250-3, 250-4 are described herein.

Figure 5A:
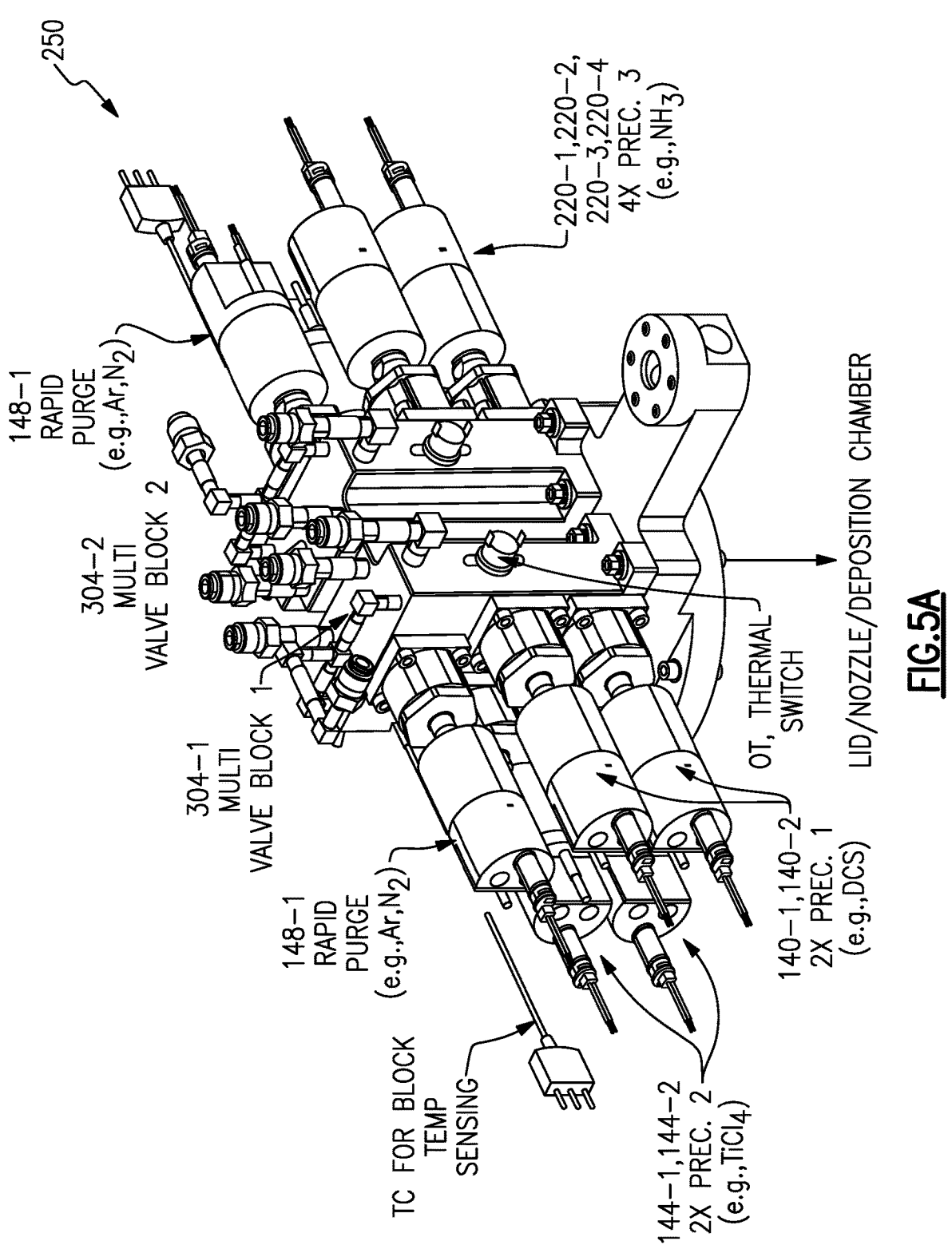
FIG. 5A shows a perspective view of a multivalve block assembly for a precursor delivery system configured with a precursor delivery line having a high conductance line portion, according to embodiments.

FIG. 5A shows a perspective view of a multivalve block assembly for a precursor delivery system configured with a precursor delivery line having a high conductance line portion, according to embodiments. The multivalve block assembly 250, which can correspond to any one of the multivalve block assemblies 250-1, 250-2, 250-3, 250-4 (FIG. 2B), can similarly correspond to the multivalve block assembly 150 schematically depicted in FIG. 1. The multivalve block assembly 250 is divided into two halves, each comprising one of first and second multivalve blocks 304-1, 304-2. Each of first and second multivalve blocks 304-1, 304-2 has connected thereto a plurality of ALD valves. By way of example only, in the illustrated embodiment, the first multivalve block 304-1 is configured to deliver a first precursor (Prec. 1), e.g., $TiCl_4$, through two first precursor ALD valves 140-1, 140-2 connected thereto, and a second precursor (Prec. 2), e.g., $SiCl_2H_2$, through two second precursor ALD valves 144-1, 144-2 connected thereto. The first multivalve block 304-1 is further configured to deliver a purge gas, e.g., $N_2$ or Ar, through a first purge gas ALD valve 148-1 connected thereto. The second multivalve block 304-2 is configured to deliver a third precursor (Prec. 3), e.g., $NH_3$, through four precursor ALD valves 220-1, 220-2, 220-3, 220-4 connected thereto. The second multivalve block 304-2 is further configured to deliver a purge gas, e.g., $N_2$ or Ar, through a second purge gas ALD valve 148-2 connected thereto. Thus configured, multivalve block assembly 250 comprises two or more atomic layer deposition (ALD) valves configured to deliver the same precursor for three precursors and a purge gas, according to embodiments. The illustrated multiblock assembly 250 has coupled thereto 10 ALD valves. However, embodiments are not so limited and the number of ALD valves can be greater or fewer than 10.

Still referring to FIG. 5A, the multivalve block assembly 250 is connected at the bottom to a central region of a top surface of a lid of the deposition chamber 102 (FIG. 1). The top surface of the lid is physically outside the deposition chamber 102. As configured, the multivalve block assembly 250 is configured to position the ALD valves directly above a central region of the substrate inside the deposition chamber 102. The precursor and purge gas ALD valves are connected to the multivalve block assembly 250 disposed outside of the thin film deposition chamber 102, and the multiblock assembly 250 is configured to serve as a hub to receive and introduce the precursors and the purge gas into the thin film deposition chamber 100 (FIG. 2B) through the respective ALD valves. Inside the process chamber, the lid has attached thereon a nozzle 108 (FIG. 1), which is in turn connected to a gas distribution plate 112 (FIG. 1), also referred to as a showerhead, configured to diffuse the precursor(s) over a substrate 120 (FIG. 1) on the susceptor 116 (FIG. 1).

Figure 5B:
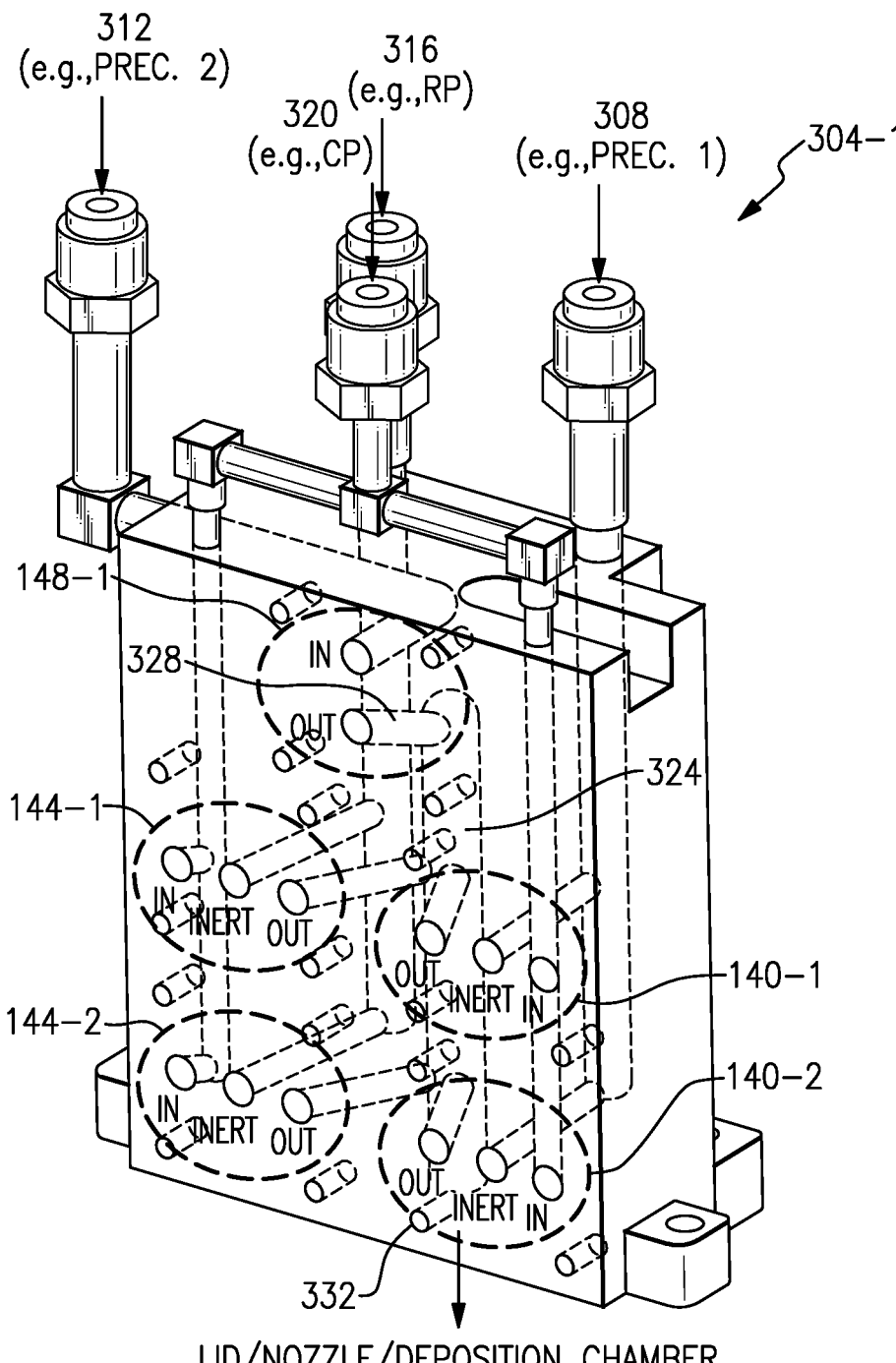
FIG. 5B shows a perspective view of one of the multivalve blocks illustrated in FIG. 5A configured to couple a plurality of ALD valves to a common gas distribution plate, according to embodiments.

FIG. 5B shows a perspective view of one of the multivalve blocks illustrated in FIG. 5A configured to couple a plurality of ALD valves connected in parallel to a common gas distribution plate, according to embodiments. A multivalve block, which may be a solid block having conduits or channels formed therein, is disposed outside of the thin film deposition chamber 102 (FIGS. 1, 2B) and serves as a hub to receive the first one of the precursors and channel the precursors and purge gas through internal conduits or channels defined therein. In particular, FIG. 5B shows a perspective view of the first multivalve block 304-1 illustrated in FIG. 5A. For clarity, the first multivalve block 304-1 is shown without the ALD valves attached thereto. Instead, the attachment locations are denoted by dotted line circles for the two first precursor ALD valves 140-1, 140-2 configured for delivering the first precursor (Prec. 1), e.g., $TiCl_4$, the two second precursor ALD valves 144-1, 144-2 configured for delivering the second precursor (Prec. 2), e.g., $SiCl_2H_2$, and the first purge gas ALD valve 148-1 configured for delivering the inert gas. Each of the attachment locations for the two first precursor ALD valves 140-1, 140-2 and the two second precursor ALD valves 144-1, 144-2 includes an inlet (IN), outlet (OUT) and an inert gas inlet (INERT). Unlike precursor ALD valves, which are three-port ALD valves as described above, the attachment location for the first purge gas ALD valve 148-1, which is a two-port ALD valve as described above, includes an inlet (IN) and an outlet (OUT) while an inert gas inlet is omitted.

The first multivalve block 304-1 includes a plurality of gas input ports 308, 312, 316, 320 for receiving the precursors and purge gases. In the illustrated configuration, the input ports 308 and 312 are configured for feeding the first precursor (Prec. 1), e.g., TiCl$_4$, and the second precursor (Prec. 2), e.g., SiCl$_2$H$_2$, similar to the configurations shown FIG. 5A. In addition, the inputs ports 316, 320 are configured for feeding a purge gas, e.g., N$_2$ or Ar, for delivery as rapid purge (RP) and continuous purge (CP) gases, respectively. While not shown, the second multivalve block 304-2 may be similarly configured, except for the third precursor (Prec. 3) feeding into the two precursor input ports 308 and 312. Of course, the input ports are not limited to the illustrated configuration and there may be additional or fewer input ports, depending on the number of gases and the number of delivery lines/ALD valves per gas desired.

Still referring to FIG. 5B, upon entry through the input ports 308, 312, 316, 320, the respective precursor and purge gases are routed through respective conduits before being introduced into the respective ALD valves. Each of the precursors enters the respective one of the ALD valves 140-1, 140-2, 144-1, 144-2 through the respective inlets. The CP gas enters each of the precursor ALD valves 140-1, 140-2, 144-1, 144-2 through respective ones of the purge gas inlet (INERT). The respective ones of the precursors and the CP gas exit through the respective ones of the outlets (OUTs) and travels through respective ones of outlet conduits 328 before introduced into a central conduit 324 extending in a vertical direction, before exiting the first multivalve block 304-1 though a central outlet 332, into the deposition chamber 102 (FIGS. 1 and 2B), e.g., through the nozzle 108 (FIG. 1) and the gas distribution plate 112 (FIG. 1).

The central conduit 324, which may be disposed over a central region of a substrate 120 (FIG. 1), is configured to merge the precursors and the purge gas from multiple ALD valves before being introduced into the deposition chamber through, e.g., the nozzle 108 (FIG. 1) prior to being distributed by the gas distribution plate 112 (FIG. 1). Thus, in the illustrated configuration, the central conduit 324 is the final conduit before the precursors and purge gas are introduced into the deposition chamber 102. The inventors have discovered that the configuration of multivalve block assembly 250 (FIG. 5A) including the centrally disposed position and the arrangement of the conduits can be critical for realizing various advantages, including fast precursor delivery times. For example, the inventors have discovered that the vertical position of the ALD valves, disposed vertically above the surface of the substrate 120 (FIG. 1) can be critical in achieving less than 1 second exposure time for substantially saturating the substrate surface with each precursor. As described herein, substantial saturation refers to a condition where increasing the exposure time does not substantially increase the growth rate. For example, for various materials, increasing the exposure time by 20%, 50%, 100%, or a value in a range defined by any of these values does not result in the growth rate increasing by more than 1%, 2%, 5%, 10% or a value in a range defined by any of these values.

In particular, still referring to FIG. 5B, among various design parameters, the inventors have discovered that the vertical positions of the outlets (OUT) of the precursor and purge gas ALD valves, which define the distances from the ALD valves to the central outlet 332, and the diameter of the central conduit 324, the combination of which defines the conductance of the central conduit 324, can be critical for reducing the residence time of the precursors from the ALD valves to the substrate. To reduce the precursor residence time, according to various embodiments, the vertical positions of the outlets (OUT) of the precursor and purge gas ALD valves relative to the central outlet 332 defining a bottom end of the central conduit 324, the maximum value of which is defined by the length of the central conduit 324, is less than 5", 4", 3", 2", 1" or has a value in a range defined by any of these values. In addition, the central conduit 324 has a diameter greater than 0.2", 0.30", 0.40", 0.50", 0.60" or a value in a range defined by any of these values. In the illustrated example, the length of the central conduit 324 is about 3.7" and the outlet of each of the precursor ALD valves 140-1, 140-2, 144-1 and 144-2 is disposed within about 2.0" of the central outlet 332. Because the OUT of the first purge ALD valve 148-1 for introducing rapid purge (RP) is disposed above the precursor ALD valves 140-1, 140-2, 144-1 and 144-2, the OUT of the first purge ALD valve 148-1 is disposed farther, within about 4" of the central outlet 332. In addition, the central conduit 324 has a diameter of 0.375".

The inventors have further discovered that the length of the outlet conduits 328, which define the conductance of the from the outlets (OUT) of the ALD valves to the central conduit 324, and the diameter of the outlet conduits 328, the combination of which defines the conductance of the outlet conduits 328, can also be critical for reducing the residence time of the precursors from the ALD valves to the substrate. To reduce the precursor residence time, according to various embodiments, the outlet conduits 328 can be designed to have a length less than 2", 1.5", 1", 0.5" or a value in a range defined by any of these values. In addition, the outlet conduits 328 have a diameter greater than 0.10", 0.20", 0.30", 0.40" or a value in a range defined by any of these values. In the illustrated example, the length and diameter of the outlet conduit 328 are 0.86" and 0.216", respectively.

Still referring to FIG. 5B, the inventors have further discovered that the numbers of bends in the overall lengths of the conduits between the input ports 308, 312, 316, 320, and the central outlet 332 can be kept low to improve the conductance through the conduits, and thereby improve the conductance and gas delivery time to the substrate. According to various embodiments, the number of bends do not exceed three, two or one. In the illustrated example, the number of bends in the each of the overall lengths of the conduits between the input ports 308, 312, 316, 320 and the central outlet 332 does not exceed four-two or three bend between the input ports 308, 312, 316, 320 and the respective IN of the ALD valves 140-1, 140-2, 144-1, 144-2, 148-1, and one bend between the respective OUT of the ALD valves and the central outlet 332.

Furthermore, the inventors have further discovered that it is advantageous to have the central vertical axis of the multivalve block 250, the central conduit 324 and/or the central outlet 332 (FIG. 5B), be aligned closely to the central positions of the lid of the deposition chamber and/or the substrate, to minimize the gas residence time and/or the gas delivery time to the substrate. According to various embodiments, a lateral offset between the central vertical axis of the multivalve block 250, the central conduit 324 and/or the central outlet 332 (FIG. 5B), and the central positions of the lid of the deposition chamber and/or the substrate, does not exceed 2", 1", 0.5", 0.25" or has a value in a range defined by any of these values.

Still referring to FIG. 5B, thus configured, multiple ALD valves configured to deliver the same gas (precursor or purge gas) can be commonly connected upstream to a common one of input ports 308, 312, 316, 320. After splitting into individual inlet conduits and feeding into respective ALD valves, each gas is delivered into the deposition chamber 102 (FIGS. 1, 2B) through the common central conduit 324. Thus configured, two or more atomic layer deposition (ALD) valves connected to the first multivalve block 304-1 are advantageously configured to supply the same gas into the deposition chamber simultaneously or sequentially.

Figure 5C:
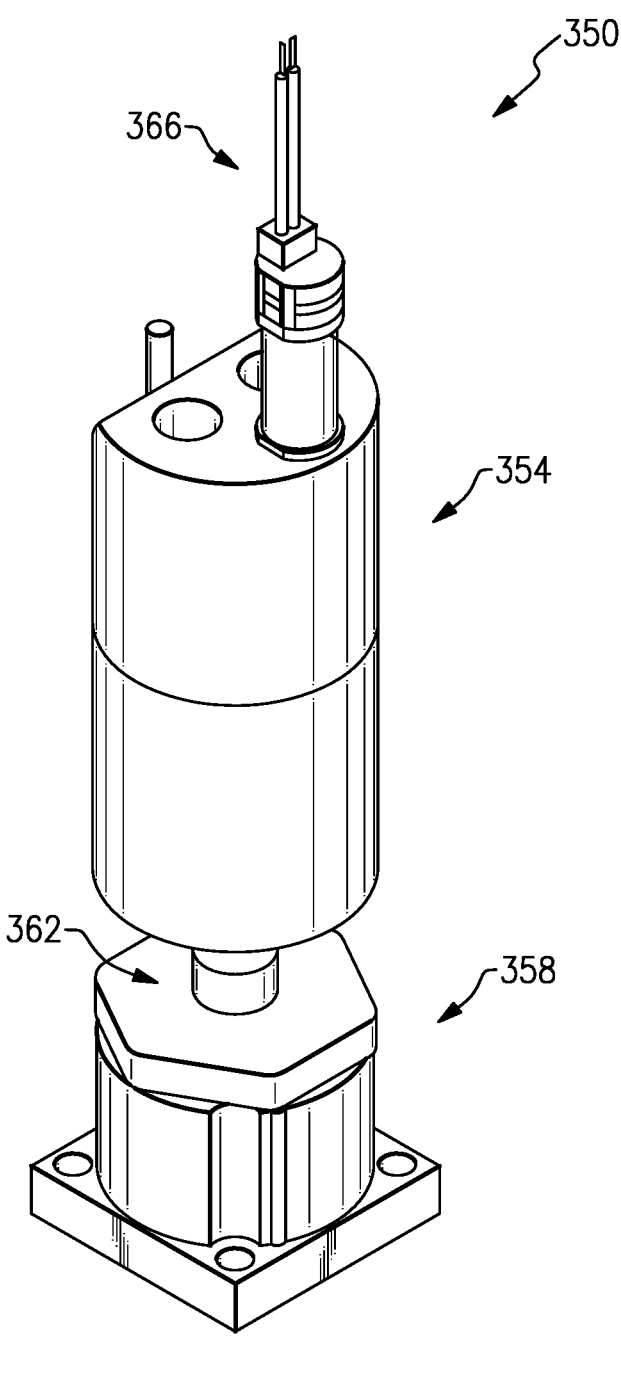
FIG. 5C shows a perspective view of one of the ALD valves configured to couple to the multivalve block illustrated in FIG. 5B, according to embodiments.

FIG. 5C shows a perspective view of one of the ALD valves configured to couple to the multivalve block illustrated in FIG. 5B, according to embodiments. The illustrated ALD valve 350 can represent one of the first precursor ALD valves 140-1, 140-2, the second precursor ALD valves 144-1, 144-2 and the purge gas ALD valve 148-1 described above with respect to FIGS. 5A and 5B, according to embodiments. The illustrated ALD valve 350 is divided into an upper part 354 and a lower part 358 coupled to a multivalve block such as that illustrated in FIG. 5B. The upper part 354 and the lower part 358 are connected by a coupling portion 362 pneumatically coupling the upper and lower parts 354, 358. The illustrated ALD valve 350 additionally includes a thermocouple unit 366 for temperature sensing and/or controlling. The upper part 354 includes a pneumatic actuator assembly including a solenoid pilot valve, among various other components. The lower part 358 includes a valve body part including a valve body, a valve diaphragm and a valve seat, among various other components. The position of the valve diaphragm can be monitored by a position sensor. As configured, the ALD valve 350 can be configured as a pilot-operated diaphragm solenoid valve. As described herein, a pilot-operated solenoid valve refers to a solenoid valve that uses a differential pressure of the medium over the valve ports to open and close the valve. A pilot-operated diaphragm solenoid valve employs the use of a small chamber directly above the diaphragm to assist in the operation of the valve. Process fluid is allowed to enter the chamber through a small orifice in the inlet port, and in a normally closed valve, compresses against the diaphragm and forces is against the seat to maintain the closing seal. Once current is applied to the pilot solenoid, the diaphragm is pulled upwards against the spring pressure, and the pilot fluid in the chamber is forced back through the orifice in the inlet port where it re-joins the main flow through the valve body. Pilot-operated diaphragm solenoid valves can operate with high speed (response time less than 30 msec.) In addition, pilot-operated diaphragm solenoid valves can provide relatively high flow rates and can operate at higher pressure and temperature ranges, with lower power consumption, compared to direct-acting solenoid valves.

Figure 5D:
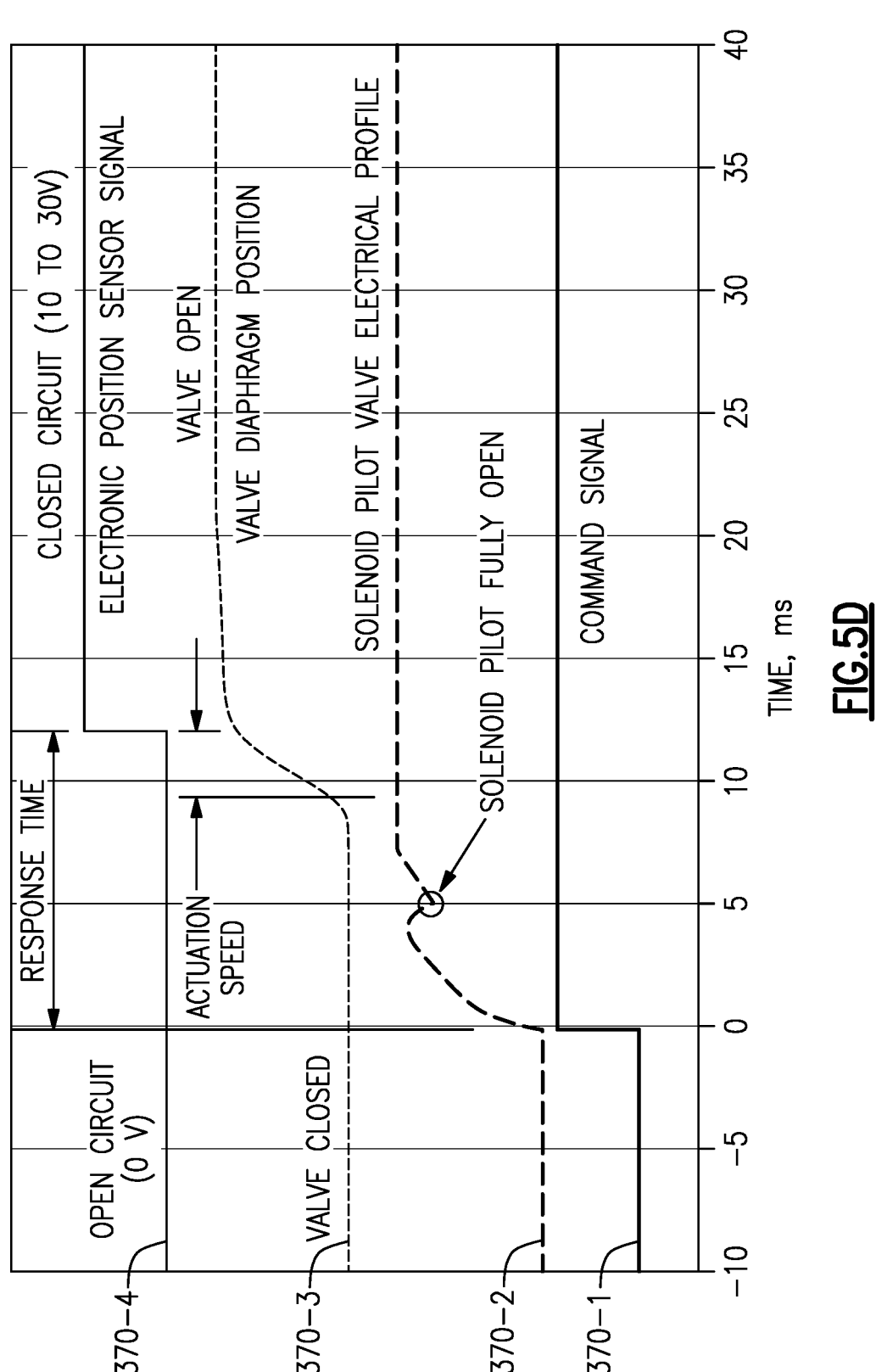
FIG. 5D is an example experimental chart illustrating various signals associated with actuation of an ALD valve such as the one illustrated in FIG. 5C, according to embodiments.

FIG. 5D is an example experimental chart illustrating various signals associated with actuation of an ALD valve such as the one illustrated in FIG. 5C, according to embodiments. The experimental chart illustrates, by way of example, a curve 370-1 corresponding to a command signal that is electronically sent to an ALD valve from a valve controller, a curve 370-2 corresponding to a solenoid pilot valve electrical profile, a curve 370-3 corresponding to a diaphragm position and a curve 370-4 corresponding to an electronic position sensor signal. In operation, when a command signal is given by a valve controller as shown in the curve 370-1, the pilot valve is activated, as shown in the curve 370-2. After the solenoid pilot valve fully opens, the diaphragm changes its position and the valve opens, as shown in the curve 370-3. As shown in FIG. 5D, the time duration between the opening of the valve as verified by the sensor and the opening of the pilot valve defines the actuation speed. After the valve fully opens, the position sensor senses the position of the diaphragm and determines that the valve has completed its opening. As defined herein, a response time of an ALD valve corresponds to, as illustrated in FIG. 5D, the time it takes, from the time a command signal is electronically sent to an ALD valve from a valve controller to the time the ALD valve to fully opened or closed, as sensed by the diaphragm position sensor. For the illustrated ALD valve, the actuation speed is less than 5 ms and the response time is less than 15 ms.

As discussed above, the precursor delivery systems disclosed herein allow for a flow rate of a precursor through a high conductance line portion and an ALD valve that is much higher than conventional thin film deposition systems, such that an ALD cycle time can be significantly decreased. In addition, the inventors have discovered that the duration of an ALD cycle can be reduced by various other improvements disclosed herein.

The inventors have discovered that reducing the distance between the outlet (OUT) of ALD valve(s) and the substrate (valve-to-substrate distance) can advantageously and critical further reduce the time needed for sufficient substantial surface saturation and/or ALD cycle time. Thus, according to embodiments, the ALD valves according to embodiments are disposed directly over the lid portion of each processing station, which is in turn disposed over a corresponding susceptor. The ALD valves are, e.g., disposed within 30", 25", 20", 15", 10", 5", 3" or a distance within a range defined by any of these values, or 50 cm, 40 cm, 30 cm, 20 cm, 10 cm, 5 cm or a distance within a range defined by any of these values, relative to a main surface of the substrate (FIG. 1). The valve-to-substrate distance can be a sum of the vertical distance between the an outlet (OUT) of a precursor ALD valve relative to the central outlet 332 (FIG. 5B) defining a bottom end of the central conduit 324 (FIG. 5B), and the vertical distance from the central outlet 332 to the substrate surface.

The inventors have discovered that the arrangement of the tubing between the actuator(s) of the ALD valve(s) and a solenoid of the pilot valve can further affect the ALD valve response time. In particular, the inventors have discovered that reducing the length of the tubing advantageously reduces the valve response time. The inventors have discovered that by reducing the length of the tubing, which can be ⅛" or ¼" in diameter, between the actuator assembly of the ALD valve in the upper part 354 (FIG. 5C) and the valve body part in the lower part 358 (FIG. 5C), and more particularly, e.g., the distance between the solenoid in the actuator assembly and the diaphragm in the body, the response time can be further reduced. According to embodiments, this distance is less than 5", 4", 3", 2", 1", 0.5", or has a value in a range defined by any of these values, or 10 cm, 8 cm, 6 cm, 4 cm, 2 cm, 1 cm or a value in a range defined by any of these values. For example, by reducing the length from 36 inches to 3 inches, it was found that the response time can be reduced by as much as 10 ms.

Thus configured, the ALD valves according to embodiments are configured to operate with an actuation speed and a response time that are significantly improved compared to conventional valves in ALD systems. According to various embodiments, the actuation speed of the ALD valve can be reduced to be less than 10 ms, 5 ms, 4 ms, 3 ms, 2 ms, or a value in a range defined by any of these values, and the response time can be reduced to be less than 30 ms, 25 ms, 20 ms, 15 ms, 10 ms, 5 ms, or a value in a range defined by any of these values. These values can be achieved, e.g., with 50-90 psig actuation pressure.

The inventors have also found that valve coefficients should be optimized to increase the flow rate for a given pressure drop to enhance the response time. According to various embodiments, the ALD valves have a valve flow coefficient ($C_v$) exceeding 0.20, 0.30, 0.40, 0.50, 0.60, 0.70 or a value in a range defined by any of these values.

Under some circumstances, the ALD valves according to embodiments are advantageously configured to be operated at elevated temperatures. For example, when it is desirable for a precursor, e.g., a vaporized liquid precursor, to be introduced into the deposition chamber at an elevated temperature, it may be advantageous for the corresponding ALD valve and/or the multivalve block to be heated to a temperature greater than room temperature, e.g., to match the precursor temperature at the point of introduction into the multivalve block. According to various embodiments, the ALD valves are configured to operate at valve temperature exceeding 80° C., 100° C. 150° C., 200° C., 250° C. or a temperature in a range defined by any of these values. In particular, referring back to FIG. 5C, the lower part 358 may include a heater for heating the valve body part. In these embodiments, the coupling portion 362 may include a thermally insulating housing portion to reduce the heating effect on the upper part 354, because heating may have detrimental effects on the operation of the actuator assembly, e.g., reduced repeatability of the actuation speed.

According to various embodiments, each of the ALD valves are configured for open/close cycles exceeding 2 million, 5 million, 10 million, 20 million, 50 million, 100 million, or a value in a range defined by any of these values, before replacement or repair. When a single ALD valve is used for a given precursor, a preventive maintenance may be performed after such number of cycles. Advantageously, when two or more valves are alternatingly used to introduce a given precursor, the lifetime of the ALD valves on a per wafer processing basis can be proportionally increased. It will be appreciated increasing the time duration between preventive maintenance or chamber openings can greatly enhance productivity and reduce production cost.

Conformal TiN-Based Thin Film Deposition with High Step Coverage Using High Speed Cyclic Deposition By providing the high conductance line portion serving as intermediate precursor reservoirs in the precursor delivery lines as disclosed herein, the precursor delivery system according to embodiments advantageously improves the speed and stability of the precursors delivered into the process chamber. The increased dosage and stability of the precursors delivered advantageously enables various advantageous methods of depositing a thin film. According to various embodiments, a method of depositing a thin film comprises alternatingly exposing a substrate in a thin film deposition chamber to a plurality of precursors. Exposing the substrate comprises introducing one of the precursors into the thin film deposition chamber through precursor delivery lines each configured to supply the one of the precursors. Alternatingly exposing the substrate comprises pressurizing the high conductance line portion to a first pressure with the first one of the precursors with the final valve, e.g., an ALD valve closed. Subsequently, the final valve is opened for a duration such that the pressure in the high conductance line portion drops by a relatively small amount compared to conventional systems. For example, the pressure in the high conductance line portion remains above a second pressure lower than the first pressure by less than 10% or any other value disclosed above with respect to FIG. 4B. As described above, in carrying out the method, the inventors have determined that one or more of a pressure inside the high conductance line portion immediately before actuating the ALD valve, a pressure change in the high conductance line portion during exposure, a run-to-run standard deviation of the mean pressure inside the high conductance line portion, and a run-to-run pressure drift of the mean pressure inside the high conductance line portion can be critical for certain film characteristics, such as step coverage.

Figure 6:
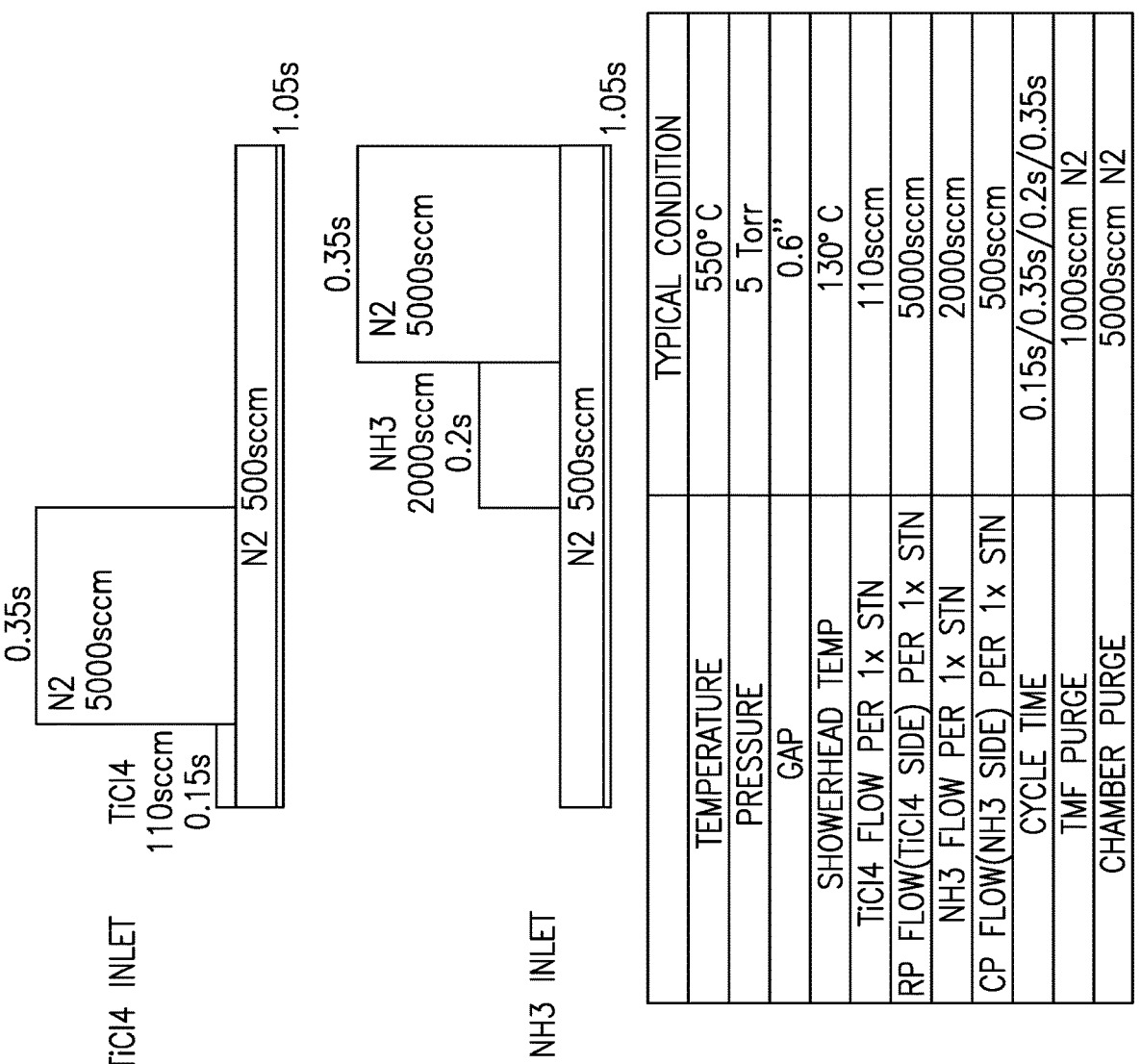
FIG. 6 schematically illustrates an example precursor delivery sequence for delivering precursors using the precursor delivery system according to embodiments.

FIG. 6 illustrates, by way of example only, an example precursor delivery sequence for delivering one or more precursors using the precursor delivery system, according to some embodiments. A first and second precursor inlets are connected to first and second precursor delivery lines including high conductance line portions arranged as described above. An ALD cycle comprises a first subcycle for exposing a substrate to the first precursor, and a second subcycle for exposing the substrate to the second precursor. As described above, each of the precursor ALD valves is a three-port valve, and in some implementations, a continuous purge (CP) gas, e.g., an inert gas, may be flown through the ALD valves while the substrate is exposed to the first precursor and/or the second precursor. In the illustrated embodiment, each of the first and second subcycles further comprises a rapid purge (RP) by an inert gas following the exposure to one or both of the first and second precursors, respectively. The rapid purge may be performed using a purge ALD valve as describe above. The rapid purge is higher in magnitude than the continuous purge.

Advantageously, one or both of the first and second precursors may be introduced into the thin film deposition chamber through respective ones of the precursor delivery lines including increased conductance line portions and ALD valves, as described above. Advantageously, an exposure time to reach a saturation level can be substantially reduced for one or both of the first and second precursors. For example, according to some embodiments, for a given precursor, relative to an exposure time to reach a saturation level using conventional gas delivery lines, the exposure time can be reduced by more than 20%, 40%, 60%, 80%, or a value in a ranged defined by any of these values. The surface saturation level can be inferred, e.g., based on deposition rate. That is, relative to an ALD process using a conventional precursor delivery line for a given precursor, substantially the same thickness can be achieved while reducing the exposure time for the precursor by more than 20%, 40%, 50%, 60%, 80%, or a value in a ranged defined by any of these values.

According to embodiments, the exposure time of one or both of the first and second precursors can be less than 1.0 sec., 0.8 sec., 0.6 sec, 0.4 sec, 0.2 sec., 0.1 sec., 0.05 sec., 0.01 sec. or a value in a ranged defined by any of these values. The thin film deposition system is configured to introduce one or both of the first and second precursors through the precursor delivery lines according to embodiments at flow rates such that a surface of the substrate substantially reaches a saturation level, e.g., a saturation level greater than 40%, 60%, 80% or a value in a range defined by any of these values, within the exposure time. In embodiments where a rapid purge follows an exposure to a precursor, durations of one or both of the first and second subcycles can be less than 1.0 sec., 0.8 sec., 0.6 sec, 0.4 sec, 0.2 sec., 0.1 sec., 0.05 sec., 0.01 sec., or a value in a ranged defined by any of these values. By reducing the exposure times of one or both of the first and second precursors, the durations of one or both of the corresponding first and second subcycles may be reduced, thereby reducing the overall ALD cycle time. According to embodiments, a duration of an overall ALD cycle is less than 2.0 sec., 1.5 sec, 1.0 sec., 0.85 sec., 0.5 sec., or a value in a range defined by any of these values.

FIG. 6 illustrates, by way of example only, one specific example precursor delivery sequence for delivering precursors for cyclic deposition or ALD of TiN using $TiCl_4$ and $NH_3$. The illustrated upper exposure cycle can correspond to the exposure cycles that can be implemented using high conductance line portions and ALD valves described herein, and can represent a $TiCl_4$ exposure cycle through first precursor ALD valves 140-1, 140-2 (FIG. 5A) Similarly, the illustrated lower exposure cycle can correspond to a $NH_3$ exposure cycle through second precursor ALD valves 144-1, 144-2 (FIG. 5A). A process station similar to that described above with respect to FIG. 1 or 2B can be employed. For example, the process station may be configured to deliver $TiCl_4$ through two first precursor ALD valves 140-1, 140-2 (FIG. 5A) and $NH_3$ through four second precursor ALD valves 220-1, 220-2, 220-3, 220-4 (FIG. 5A). Each of the precursor ALD valves 140-1, 140-2, 220-1, 220-2, 220-3, 220-4 (FIG. 5A) are also configured to continuously flow a continuous purge (CP) gas, e.g., an inert gas, therethrough. The process station may also be configured to deliver a rapid purge (RP) gas, e.g., an inert gas, through two purge gas ALD valves 148-1, 148-2. The illustrated table shows typical parameters for a given processing station and flow conditions for different ALD valves. By delivering, in this example, $TiCl_4$ simultaneously through two precursor ALD valves 140-1, 140-2 and $NH_3$ simultaneously through four precursor ALD valves 220-1, 220-2, 220-3, 220-4 and $N_2$ through one of two purge gas ALD valves 148-1, 148-2, during respective subcycles, combined flow rates of 220 sccm and 8000 sccm for $TiCl_4$ and $NH_3$ can be achieved, respectively. In combination with the 5000 sccm flow rate for each of purge gas ALD valves 148-1, 148-2, $TiCl_4$ exposure subcycle time of 0.5 sec. and $NH_3$ exposure subcycle time of 0.35 sec. can be achieved, for a total ALD cycle time of 1.05 sec.

Advantageously, by flowing relatively high amounts of precursor and the CP gas through two or more precursor ALD valves, relatively high chamber pressure can be achieved without reducing pumping power of the deposition chamber. The inventors have discovered that, when a substrate has a relatively high surface area, e.g., arising from a relatively high area density of high aspect ratio structures, coating the exposed surface with a thin film using ALD process recipes developed based on characterization of thin films formed on a planar or unpatterned substrate or a substrate with relatively low surface area or low area density of high aspect ratio structures may yield thin films having different characteristics at different parts of the exposed surface. For example, the conformality or step coverage as described above may be significantly worse in high aspect ratio structures in substrates having a relatively high area density thereof. Other characteristics that may also be different at different parts of the exposed surface include film stoichiometry, surface roughness, electrical resistivity and film density, to name a few. Without being bound to any theory, one reason for the low uniformity of the characteristics may be the significantly increased exposed surface area of the substrate relative to a planar substrate. Because of the increased exposed surface area, different parts of the exposed surface may receive different magnitudes of the flux of precursors, such that different amounts of precursors may be adsorbed on different parts of the exposed surface. By way of a simplified example only, when a 300 mm semiconductor substrate has formed thereon hundreds of dies each having of the order of $1 \times 10^{10}$ or more transistors and each transistor has one or more vias having a diameter of 10-100 nm and an aspect ratio of 1 to 100, the surface area exposed to precursors during the deposition of the thin film can exceed the surface area of a corresponding unpatterned substrate 10, 100, 1000 or more. In addition, local deposition conditions at different parts of the exposed surface may be different. For example, local pressure inside a deep trench or a via may be different, e.g., lower, compared to regions outside the deep trench or the via. In addition, under vacuum conditions, because gas molecules undergo more collisions with sidewalls of the trench or the via, upper portions of the deep trench or the via may adsorb a higher amount of precursor molecules from being subjected to a higher flux.

According to various embodiments described herein, by utilizing higher deposition pressure, among other things, the inventors have discovered that the deposition methods described herein are particularly advantageous for forming thin films comprising TiN, TiSiN and/or TiAlN at different parts of the exposed surface with higher uniformity with respect to various physical characteristics including conformality, step coverage, film stoichiometry, surface roughness, electrical resistivity and film density, to name a few. Thus, the thin film comprising TiN, TiSiN and/or TiAlN formed according to deposition methods disclosed herein have higher uniformity at both local (e.g., within a trench or via) and global (e.g., within-wafer) levels with respect to one or more of these physical characteristics. Thus, the deposition methods according to embodiments are particularly advantageous for forming the thin film comprising TiN, TiSiN and/or TiAlN on a substrate that comprises a surface topography such that a ratio of a surface area of the semiconductor substrate exposed to the one or more vapor deposition cycles to a surface area of a corresponding unpatterned semiconductor substrate exceeds 2, 5, 10, 20, 50, 100, 200, 500, 1000 or has a ratio in a range defined by any of these values, or higher.

Alternatively or additionally, the deposition methods according to embodiments are additionally particularly advantageous for forming the thin film on a substrate that comprises high aspect ratio structures having an opening width less than 1 micron, 500 nm, 200 nm, 100 nm, 50 nm, 20 nm or a value in a range defined by any of these values, an aspect ratio exceeding 5, 10, 20, 50, 100, 200 or a value in a range defined by any of these values, and an area density such that the surface area is greater than a that of a planar substrate as described above. Substrates having such topography may be conformally coated with thin films comprising TiN, TiSiN and/or TiAlN according to embodiments with a step coverage as defined above that exceeds 50%, 60%, 70%, 80%, 90%, 95%, or has a value in a range defined by any of these values or higher. As discussed above, the inventors have found that process conditions for conformally coating a substrate having a relatively high area density of high aspect ratio structures may be optimized according to embodiments to achieve these results. The inventors have discovered that these results may be achieved by controlling, among other things, the reaction chamber pressure or partial pressures of precursors during exposures of the substrate, the deposition rate, the temperature or pressure of precursors being introduced into the reaction chamber, the flow rate of the precursors and the exposure time, to name a few.

The inventors have discovered that relatively higher total or partial pressures achieved using simultaneous activation of two or more precursor ALD valves can lead to improvement in conformality and step coverage when coating a substrate having a relatively high area density of high aspect ratio structures, according to embodiments. Without being bound to any theory, such improvement may be associated with, among other things, lessening the effect of locally reduced partial pressure of precursors inside the high aspect ratio vias or trenches. According to embodiments total or partial pressures of any of the individual precursors during exposing the substrate during a given subcycle (e.g., Ti precursor, N precursor and/or Si and/or Al), may be 1.0-3.0 torr, 3.0-5.0 torr, 5.0-7.0 torr, 7.0-9.0 torr, 9.0-11.0 torr, 11.0-13.0 torr, 13.0-15.0 torr, or a pressure in range defined by any of these values. In each of the exposures to the Ti precursor, the N precursor and/or the Si and/or Al precursor, the respective precursor can make up 1-2%, 2-5%, 5-10%, 10-20%, 20-50%, 50-100% of the total amount of gas molecules in the reaction chamber, or a percentage in a range defined by any of these values. The inventors have discovered that, under some circumstances, when the total or partial pressure is outside of these values, step coverage may start to degrade, among other things. Example high step coverages that have be observed experimentally are shown in FIG. 8B.

The inventors have discovered that, in part to enable relatively high throughput while delivering relatively high amounts of precursors to the reaction chamber for deposition at relatively high total or partial pressures, the flow rates of the precursors into the reaction chamber should be significantly higher than those used in process conditions for forming thin films on planar substrates and/or substrates with low (e.g., <1) aspect ratio structures. The high flow rates can in turn may be achieved by increasing one or both of the temperatures or the pressures of the precursors prior to introduction into the reaction chamber. For example, for precursors in liquid form under manufacturing conditions, the precursor bottles may be heated to temperatures higher than a room temperature, e.g., 30-60° C., 60-80° C., 80-100° C., 100-120° C., 120-150° C., or a temperature in a range defined by any of these values, to increase the vapor generation rate. The lower and upper bottle temperatures of these ranges may be determined in part based on the vapor pressure of the precursor and the decomposition temperature of the precursor, respectively. By way of example, $TiCl_4$ may be heated to about 60-80° C. On the other hand, for precursors in gas form under manufacturing conditions, the high flow rate may be achieved by increasing the gas line pressures to increase the delivery pressures to values that are much higher relative to gas line pressures used in forming thin films on relatively low surface area or planar substrates and/or substrates with low (e.g., <1) aspect ratio structures. It will be appreciated that the relatively high flow rate to achieve various advantages described herein can depend on, among other things, the pumping rate, exposure time, and volume of the reactor. To achieve flow rates adapted for depositing the thin film on substrates having a high surface area and/or high aspect ratio structures, the temperature and or pressure of the precursor, among other parameters, can be adjusted such that the flow rate of each of the Ti, N, Si and Al precursors can be, e.g., 100-1000 standard cubic centimeters per minute (sccm), 1000-2000 sccm, 2000-5000 sccm, 5000-10,000 sccm, 10,000-15,000 sccm, 15,000-20,000 sccm, or a value in a range defined by any of these values or higher. It will be appreciated that a suitable flow rate can depend, among other things, the volume of the reactor, and some of these flow rates may be suitable for single wafer reactors having a volume of about 1-2 liters.

TABLES 1A and 1B illustrate, by way of example only, an improvement in the overall ALD cycle time for an example process sequence for depositing a TiN film. TABLE 1A illustrates a recipe sequence implemented in a thin film deposition system such as that described above with respect to FIG. 2A, and TABLE 1B illustrates a recipe sequence implemented in a thin film deposition system including high conductance line portions and ALD valves such as that described above with respect to FIG. 2B, which includes gas delivery lines with high conductance line portions for each of $TiCl_4$, $NH_3$ and Ar. The two recipe sequences achieve similar dose per cycle thicknesses per cycle, with comparable step coverage. As shown, an ALD cycle of the recipe sequence illustrated in TABLE 1A lasts about 4.3 seconds, whereas a comparable ALD cycle of the recipe sequence in TABLE 1B lasts about 0.85 seconds, which represents more than a fourfold reduction in the total cycle time. Furthermore, the durations of $TiCl_4$ pulse, $TiCl_4$ purge, $NH_4$ pulse and $NH_4$ purge were reduced by factors of about 4, 10, 3 and 7, respectively.

TABLE 1A

| Comparative Recipe Sequence | | | | | | |
|---|---|---|---|---|---|---|
| $TiCl_4$ Pulse (sec.) | $TiCl_4$ Purge (sec.) | $NH_3$ Pulse (sec.) | $NH_3$ Purge (sec.) | Chamber Pressure (Torr) | $TiCl_4$ Temp. (° C.) | Susceptor Temp. (° C.) |
| 0.20 | 2.00 | 0.10 | 2.00 | 6 | 62 | 550 |

TABLE 1B

| High Speed Recipe Sequence | | | | | | |
|---|---|---|---|---|---|---|
| $TiCl_4$ Pulse (sec.) | $TiCl_4$ Purge (sec.) | $NH_3$ Pulse (sec.) | $NH_3$ Purge (sec.) | Chamber Pressure (Torr) | $TiCl_4$ Temp. (° C.) | Susceptor Temp. (° C.) |
| 0.05 | 0.2 | 0.3 | 0.3 | 6 | 60 | 450 |

As described above, the precursor delivery system according to embodiments allows for increased dosage with reduced pressure fluctuation in the gas delivery lines by providing high conductance line portion serving as an intermediate gas reservoir, in conjunction with an ALD valve, configured according to embodiments. The configuration can be especially advantageous for process chambers having multiple process stations. In addition to throughput, the increased dosage and stability of the precursors delivered by the configuration advantageously leads to increased step coverage of the thin film deposited in high aspect ratio structures.

Figure 7:
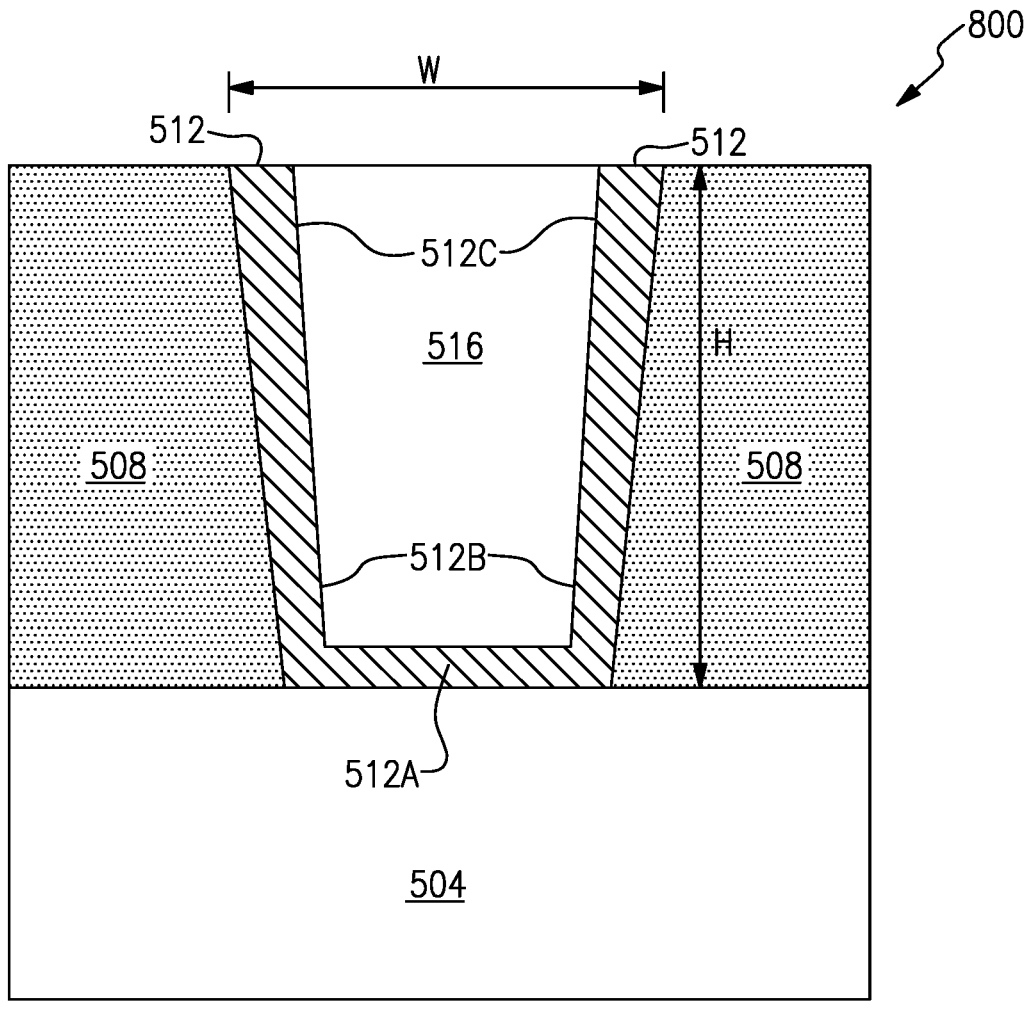
FIG. 7 schematically illustrates a cross-sectional view of a via lined with a thin film layer having different thicknesses at different portions of the via.

One measure of conformality in the context of high aspect ratio structures is referred to herein as step coverage. A high aspect ratio structure may be, e.g., a via, a hole, a trench, a cavity or a similar structure. By way of an illustrative example, FIG. 7 schematically illustrates a semiconductor structure 500 having an example high aspect ratio structure 516 formed therein, to illustrate some example metrics of defining and/or measuring conformality of thin films formed on high aspect ratio structures. The illustrated high aspect ratio structure 516 is lined with a thin film 512, e.g., TiN layer deposited according to embodiments, having different thicknesses at different portions thereof. As described herein, a high aspect ratio structure has an aspect ratio, e.g., a ratio defined as a depth or height (H) divided by a width (W) at the opening region of the high aspect ratio structure 516, that exceeds 1. In the illustrated example, the high aspect ratio structure 516 is a via formed through a dielectric layer 508, e.g., an intermetal dielectric (ILD) layer, formed on a semiconductor substrate 504, such that a bottom surface of the high aspect ratio structure 516 exposes the underlying semiconductor 504. The thin film 512 can coat different surfaces of the high aspect ratio structure 516 with different thicknesses. As described herein, one metric for defining or measuring the conformality of a thin film formed in a high aspect ratio is referred to as step coverage. A step coverage may be defined as a ratio between a thickness of a thin film at a lower or bottom region of a high aspect ratio structure and a thickness of the thin film at an upper or top region of the high aspect ratio structure. The upper or top region may be a region of the high aspect ratio structure at a relatively small depth at, e.g., 0-10% or 0-25% of the H measured from the top of the opening. The lower or bottom region may be a region of the high aspect ratio structure at a relatively high depth at, e.g., 90-100% or 75-100% of the H measured from the top of the opening. In some high aspect ratio structures, a step coverage may be defined or measured by a ratio of thicknesses of the thin film 512A formed at a bottom surface to the thin film 512C formed at upper or top sidewall surfaces of the high aspect ratio structure. However, it will be appreciated that some high aspect ratio structures may not have a well-defined bottom surface or a bottom surface having small radius of curvature. In these structures, a step coverage may be more consistently defined or measured by a ratio of thicknesses of the thin film 512B formed at a lower or bottom sidewall surface to the thin film 512C formed at an upper or top sidewall surfaces of the high aspect ratio structure.

The precursor delivery system according to embodiments, at least in part due to the relatively stable pressure inside the precursor delivery lines, gives rise to substantial improvement in step coverage in high aspect ratio structures. By employing the gas delivery lines having high conductance line portions with ALD valves, high aspect ratio structures having an aspect ratio exceeding 1, 2, 5, 10, 20, 50, 100, 200 or a value in a range defined by any of these values may be conformally coated with a thin film such as a TiN film according to embodiments with a step coverage as defined herein that exceeds 70%, 80%, 90%, 95%, or has a value in a range defined by any of these values. Thus obtained step coverage values obtained represent an improvement over corresponding step coverage values obtained using a comparable thin film deposition system having gas delivery lines without the high conductance line portions by 5%, 10%, 15%, 20% or a value in a range defined by any of these values.

TABLE 2 illustrates, by way of example only, an improvement in the step coverage achieved using a gas delivery system including high conductance line portions in the precursor delivery lines coupled to ALD valves. In TABLE 2, the first two columns represent recipe sequences implemented in a thin film deposition system such as that described above with respect to FIG. 2A, and the third column represents a recipe sequence implemented in a thin film deposition system such as that described above with respect to FIG. 2B, which includes precursor delivery lines with high conductance line portions for each of $TiCl_4$, $NH_3$ and Ar, as well as ALD valves. The three recipe sequences achieve similar thicknesses. As shown by the directly comparable recipe sequences in the first and third columns, ALD cycles of the recipe sequence implemented with high conductance line portions in the precursor delivery lines achieves a substantial improvement (>14%) in step coverage.

TABLE 2

| Process Condition | $TiCl_4$ 60° C. Limited Conductance (Low Cv Valve & Small Conductance Delivery Lines) | $TiCl_4$ 90° C. Limited Conductance (Low Cv valve & Small Conductance Delivery Lines) | $TiCl_4$ 60° C. High Conductance (High Cv Valve & Higher Conductance Delivery Lines) |
|---|---|---|---|
| Cycle Time | 4.2 sec. | 2.7 sec. | <1 sec. |
| Throughput | Low | Low | High |
| Step Coverage | 83% | 93% | 95% |

Figure 8A:
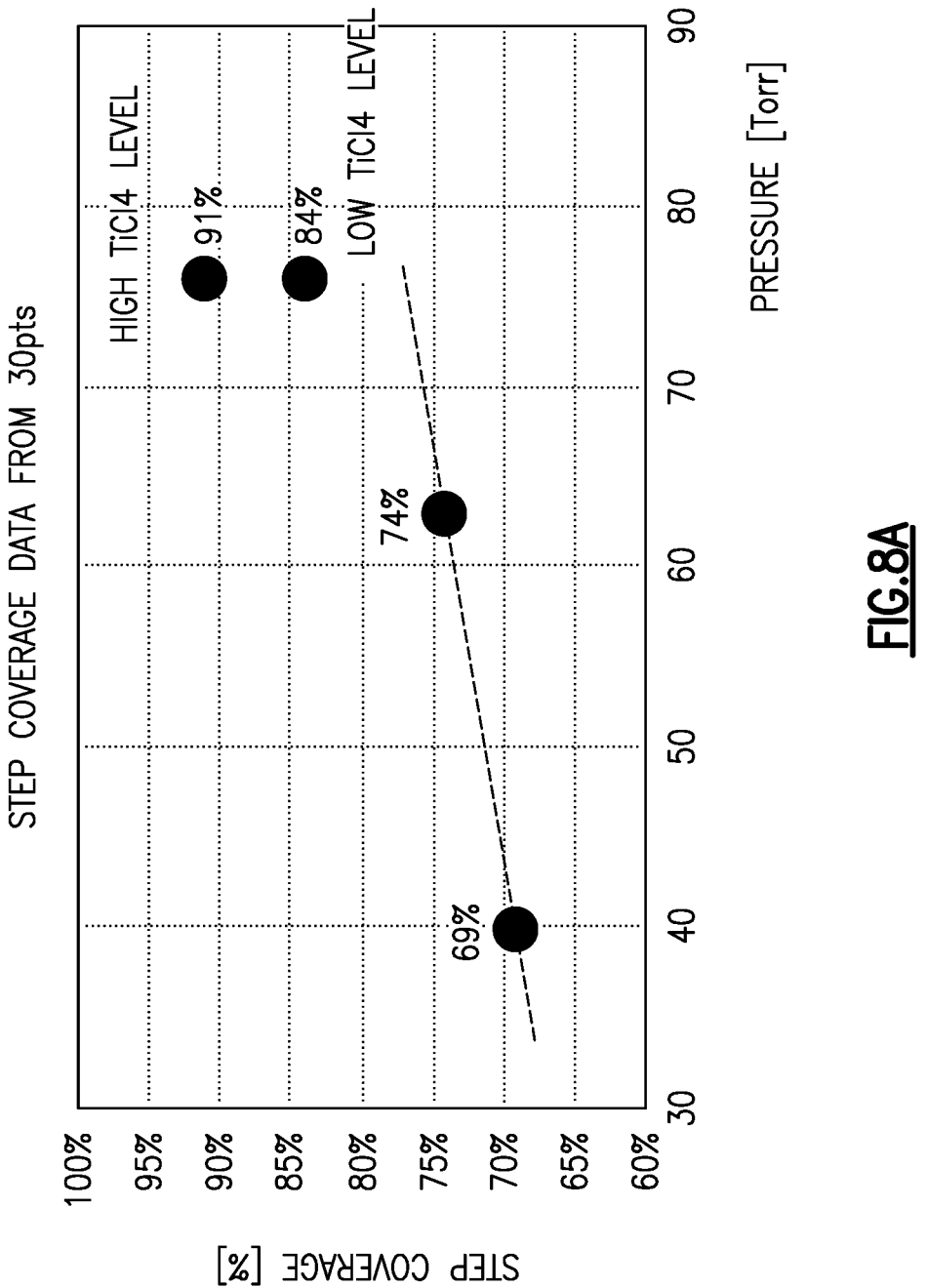
FIG. 8A illustrates measured step coverage values in high aspect ratio structures as a function of pressure in high conductance line portions of precursor delivery lines configured according to embodiments.
Figure 8B:
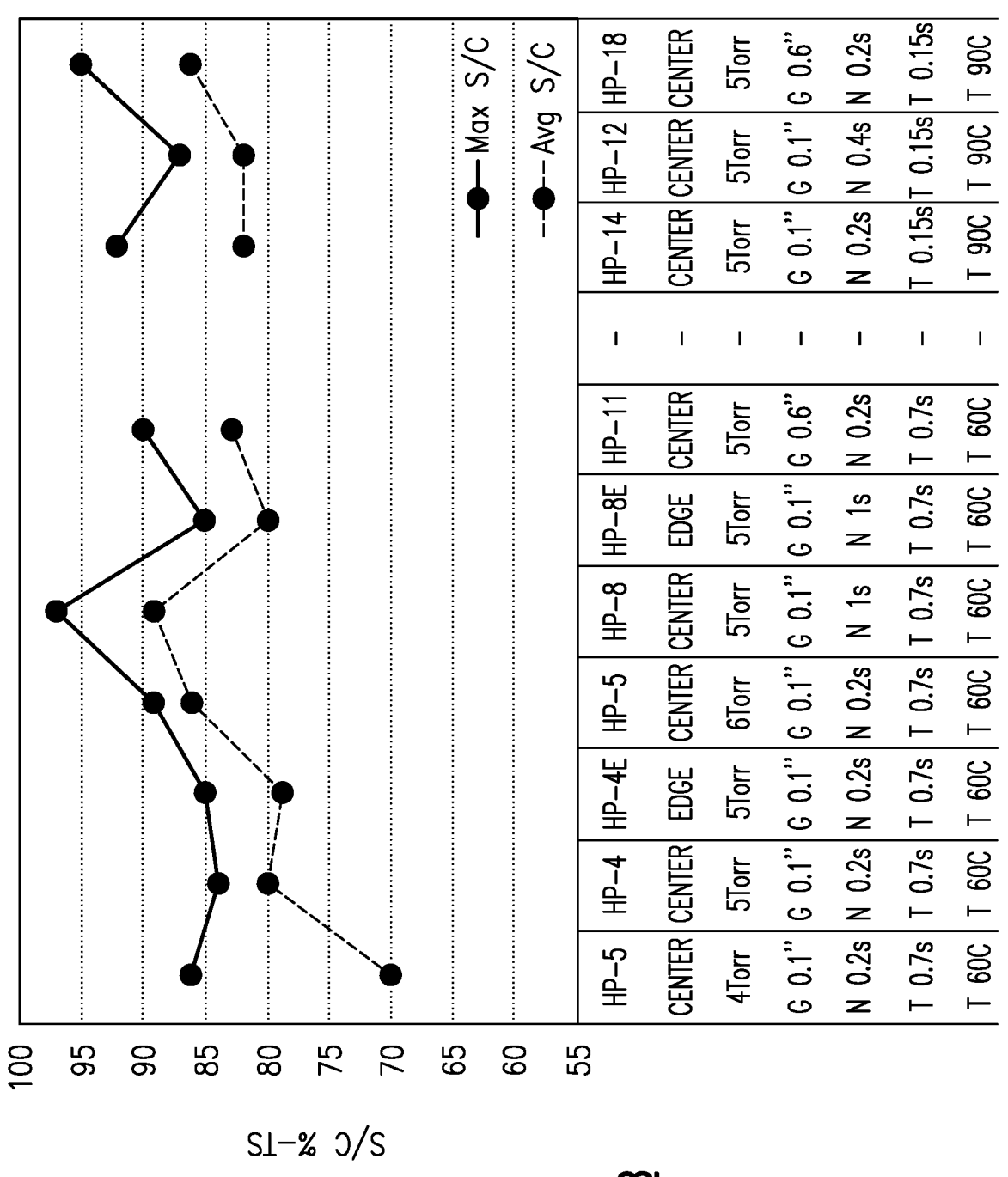
FIG. 8B illustrates measured step coverage values in high aspect ratio structures for various process conditions implemented using precursor delivery lines configured according to embodiments.

FIG. 8A illustrates measured step coverage values of TiN thin films deposited in high aspect ratio structures as a function of pre-charge pressure in high conductance line portions of the precursor delivery lines configured according to embodiments, prior to opening the ALD valve in accordance with embodiments described above. The overall deposition condition can be similar to that described above with respect to FIG. 6. As illustrated, increasing the pressure inside the high conductance line portion prior to opening the ALD valve improves the step coverage. Surprisingly, a dramatic improvement in step coverage was observed at high conductance line portion pressure exceeding about 62 Torr.

FIG. 8B illustrates measured step coverage values of TiN thin films deposited in high aspect ratio structures for various process conditions implemented using precursor delivery systems including high conductance line portions and ALD valves configured according to embodiments. The variables tested include the gap distance (G) between the substrate an the gas distribution plate (showerhead), $NH_3$ exposure time (N), $TiCl_4$ exposure time (T) and $TiCl_4$ temperature (T). Except for the Sample HP-5, all tested samples exhibited an average step coverage of about 80% or higher.

Figure 8C:
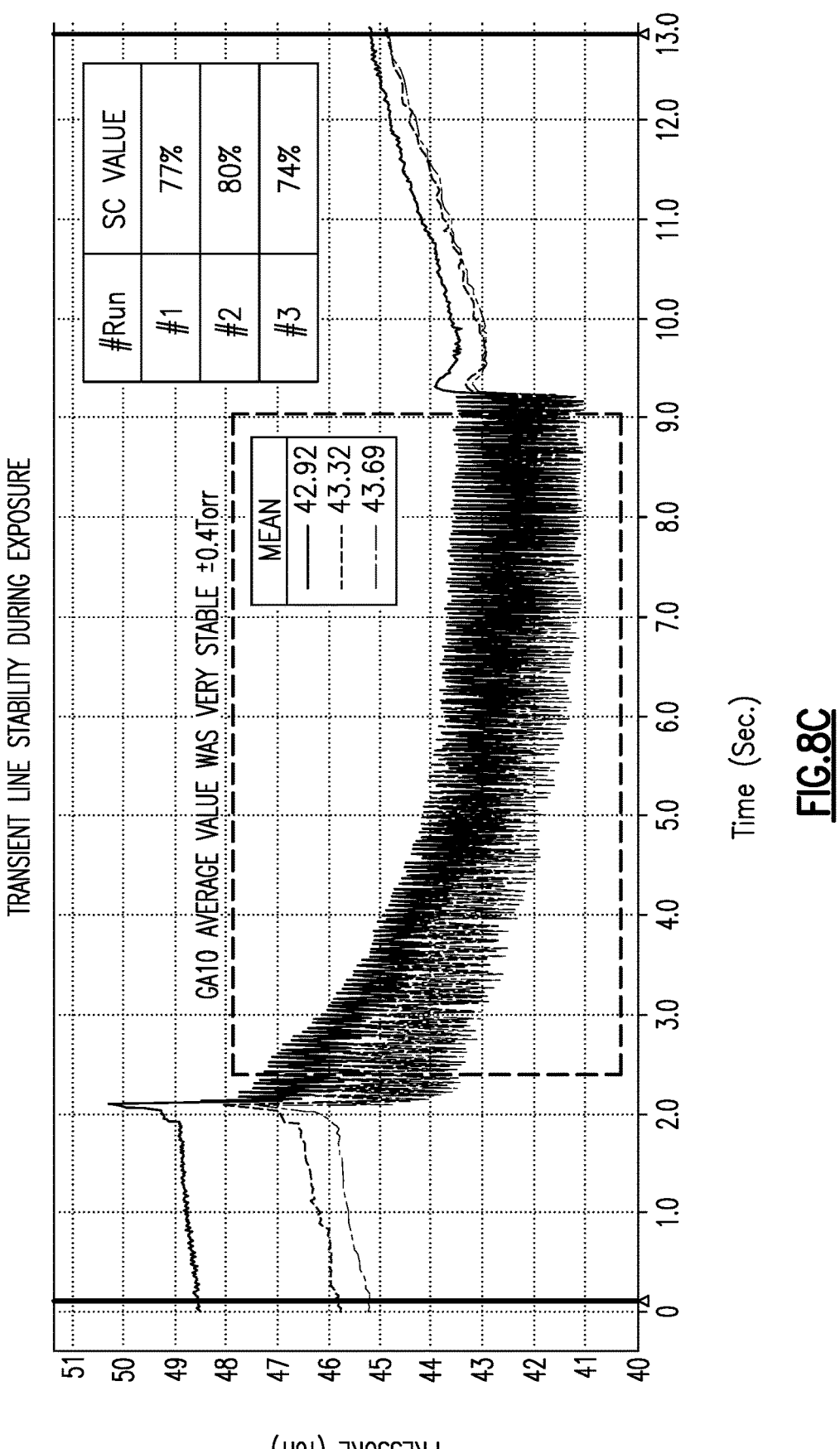
FIG. 8C illustrates pressure fluctuations in a high conductance line portion of a precursor delivery line during cyclic deposition, according to embodiments.

FIG. 8C illustrates pressure fluctuations in a high conductance line portion of a precursor delivery line during cyclic deposition of TiN according to embodiments. The traces correspond to separate runs with each peak representing an exposure. Each of the traces capture more than 20 exposures of $TiCl_4$ per second. As illustrated, for a mean pressure of about 43 Torr during multiple cycles, the standard deviation was about 0.4 Torr, which is less than about 1%. The precursor delivery systems including high conductance line portions and ALD valves enable high pressure stability, which in turn improves the step coverage of the thin film deposited in high aspect ratio structures. In addition, the drift in the mean pressure is less than about 4 Torr.

Applications

The thin films comprising TiN or TiSiN formed using different exposure pressures according to various embodiments disclosed herein can be used in a variety of applications, particularly where the substrate comprises a relatively high aspect ratio structure and/or a non-metal surface that can benefit from various advantageous characteristics of the TiN or TiSiN layer as disclosed herein. Example applications include deposition a via, a hole, a trench, a cavity or a similar structure having an aspect ratio, e.g., a ratio defined as a depth divided by a top width, that exceeds 1, 2, 5, 10, 20, 50, 100, 200 or a value in a range defined by any of these values.

By way of example, FIG. 7 schematically illustrates an application in the context of a diffusion barrier for a contact structure, e.g., a source or drain contact, formed on an active semiconductor substrate region that may be heavily doped. A portion of a semiconductor device 500 is illustrated, which includes a substrate 504 on which a dielectric layer 508, e.g., an interlayer or intermetal dielectric (ILD) layer comprising a dielectric material such as an oxide or nitride is formed. In order to form contacts to various regions of the substrate 504, including various doped regions, e.g., source and drain regions, a via or a trench may be formed through the dielectric layer 508. The via or the trench may expose various non-metal surfaces, e.g., an exposed bottom surface comprising a substrate surface, e.g., a silicon substrate surface, as well as dielectric sidewalls of the vias. The bottom and side surfaces of the via can be conformally coated with a TiN or TiSiN layer. Thereafter, the lined via may be filled with a metal, e.g., W, Al or Cu, to form a contact plug 516. For example, the via may be filled with tungsten by CVD using, e.g., $WF_6$.

The barrier layer 512 formed according to embodiments can be advantageous for various reasons. In particular, due to the conformal nature of the barrier layer 512 formed by ALD, the propensity for a pinching off during the subsequent metal fill process may be substantially reduced. In addition, as described above, the barrier layer 512 can provide effective hindrance of material transport thereacross, e.g., dopant (B, P) out-diffusion from the substrate 504, as well as in-diffusion of reactants, etchants and metals (e.g., F, Cl, W or Cu) from the contact plug formation process. The barrier effect may be enhanced by reduced surface roughness and increased step coverage. Furthermore, a layer-by-layer growth mode obtained according to embodiments may reduce the overall contact resistance of the barrier layer 512. Furthermore, due to the reduced film roughness, a relatively thinner barrier layer 512 may be formed while still accomplishing its desired barrier function, leading to further reduction in contact resistance.

Other applications of the TiN or TiSiN layers formed according various embodiments disclosed herein include conductive structures formed in recessed substrates (e.g., buried electrodes or lines), electrodes (e.g., DRAM capacitor electrodes or gate electrodes), metallization barriers for higher metal levels (e.g., barriers in vias/trenches for Cu contacts/lines), high aspect ratio vertical rod electrodes or vias for three-dimensional memory and through-silicon vias (TSVs), to name a few.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the various embodiments disclosed herein are within the scope of the disclosed technology, and the specific scope of the disclosed technology will be additionally defined by the appended claims.

In the foregoing, it will be appreciated that any feature of any one of the embodiments can be combined or substituted with any other feature of any other one of the embodiments.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features are presented in a given arrangement, alternative embodiments may perform similar functionalities with different components and/or sensor topologies, and some features may be deleted, moved, added, subdivided, combined, and/or modified. Each of these features may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of depositing a thin film, the method comprising:

providing a thin film deposition system comprising a high conductance line portion as part of a precursor delivery line between a precursor source and a final valve outside of a thin film deposition chamber, wherein the high conductance line portion is elongated in a flow direction and has a conductance that is at least four times greater than either of immediately adjacent low conductance line portions connected at opposing ends of the high conductance line portion; and alternatingly exposing a substrate in the thin film deposition chamber to a plurality of precursors in a plurality of cycles, wherein alternatingly exposing the substrate comprises pressurizing the high conductance line portion to a first pressure with a first one of the precursors with the final valve closed, and opening the final valve for a duration such that the pressure in the high conductance line portion remains above a second pressure lower than the first pressure by less than 10%.

2. The method of claim 1, wherein the duration is less than 1 sec.

3. The method of claim 2, wherein the first pressure is 70-650 Torr.

4. The method of claim 3, wherein a pressure drop between the first pressure and the second pressure is less than 50 Torr.

5. The method of claim 4, wherein a standard deviation of a mean pressure within the high conductance line portion throughout the plurality of cycles is less than 10%.

6. The method of claim 4, wherein a drift of a mean pressure within the high conductance line portion throughout the plurality of cycles is less than 10%.

7. The method of claim 1, wherein the high conductance line portion has a cylindrical shape having a diameter of 0.5-5 inches.

8. The method of claim 7, wherein the high conductance line portion further has a length such that the high conductance line portion has a volume of 0.3-5 liters.

9. The method of claim 1, wherein the high conductance line portion serves as a transient intermediate reservoir configured to store a gas precursor or a liquid precursor that has been pre-vaporized prior to reaching the high conductance line portion.

10. The method of claim 1, wherein at least a portion of the high conductance line portion is disposed directly above a lid of the thin film deposition chamber.

11. The method of claim 1, wherein the final valve is an atomic layer deposition (ALD) valve disposed directly above a lid of the thin film deposition chamber.

12. The method of claim 11, wherein during an exposure of the substrate to a precursor in the precursor source, the final valve is activated such that the precursor continuously flows from the precursor source to the thin film deposition chamber through the high conductance line portion without being interrupted by actuation of another valve.

13. The method of claim 1, wherein the thin film deposition chamber comprises a plurality of processing stations each configured for depositing a respective thin film by alternatingly exposing a respective substrate to a same or different plurality of precursors, wherein each of the processing stations comprises:

a gas distribution plate, a susceptor, and a lid enclosing the thin film deposition chamber.

14. The method of claim 13, wherein the high conductance line portion serves as an intermediate reservoir such that, during an exposure of the substrate to a precursor in the precursor source, the precursor continuously flows from the precursor source to the thin film deposition chamber through the high conductance line portion.

15. The method of claim 14, wherein the high conductance line portion serves as a dedicated reservoir for the precursor source.

16. The method of claim 11, wherein the ALD valve has a response time, between an end of a command signal and completion of opening or closing of a diaphragm thereof, of less than 30 ms.

17. The method of claim 11, wherein the ALD valve has a valve flow coefficient ($C_v$) exceeding 0.25.

18. The method of claim 11, wherein introducing the first one of the precursors into the thin film deposition chamber comprises continuously flowing an inert gas into the thin film deposition chamber through the ALD valve while introducing the first one of the precursors into the thin film deposition chamber.

19. The method of claim 1, wherein the thin film comprises a TiN thin film or a TiSiN thin film.

20. The method of claim 19, wherein the plurality of precursors comprises one or more of a Ti precursor, a Si precursor and a N precursor.

21. The method of claim 1, wherein alternatingly exposing the substrate comprises pressurizing the high conductance line portion to a third pressure with a second one of the precursors with the final valve closed, and opening the final valve for a duration such that the pressure in the high conductance line portion remains above a fourth pressure lower than the third pressure by less than 10%.

\* \* \* \* \*